US012575109B2

(12) United States Patent
Lu et al.

(10) Patent No.: US 12,575,109 B2
(45) Date of Patent: Mar. 10, 2026

(54) ANTIFERROELECTRIC NON-VOLATILE MEMORY

(71) Applicant: Taiwan Semiconductor Manufacturing Company, Ltd., Hsinchu (TW)

(72) Inventors: Chun-Chieh Lu, Taipei City (TW); Chih-Yu Chang, New Taipei City (TW); Yu-Chuan Shih, Hsinchu City (TW); Huai-Ying Huang, Jhonghe City (TW); Yu-Ming Lin, Hsinchu City (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 436 days.

(21) Appl. No.: 18/150,408

(22) Filed: Jan. 5, 2023

(65) Prior Publication Data

US 2024/0107776 A1 Mar. 28, 2024

Related U.S. Application Data

(60) Provisional application No. 63/377,493, filed on Sep. 28, 2022.

(51) Int. Cl.
| | |
|---|---|
| *H01L 29/06* | (2006.01) |
| *G11C 5/06* | (2006.01) |
| *H01L 21/02* | (2006.01) |
| *H10B 51/30* | (2023.01) |
| *H10D 62/10* | (2025.01) |

(52) U.S. Cl.
CPC ............. *H10B 51/30* (2023.02); *G11C 5/063* (2013.01); *H01L 21/02181* (2013.01); *H01L 21/02189* (2013.01); *H01L 21/0228* (2013.01); *H10D 62/118* (2025.01)

(58) Field of Classification Search
None
See application file for complete search history.

(56) References Cited

U.S. PATENT DOCUMENTS

| | | | | | |
|---|---|---|---|---|---|
| 5,959,879 | A | * | 9/1999 | Koo ........................ | G11C 11/22 257/295 |
| 11,527,553 | B2 | | 12/2022 | Lin et al. | |

(Continued)

FOREIGN PATENT DOCUMENTS

| | | |
|---|---|---|
| TW | 202103304 A | 1/2021 |
| TW | 202205623 A | 2/2022 |
| TW | 202215543 A | 4/2022 |

*Primary Examiner* — Asok K Sarkar

(74) *Attorney, Agent, or Firm* — Harrity & Harrity, LLP

(57) ABSTRACT

An antiferroelectric field effect transistor (Anti-FeFET) of a memory cell includes an antiferroelectric layer instead of a ferroelectric layer. The antiferroelectric layer may operate based on a programmed state and an erased state in which the antiferroelectric layer is in a fully polarized alignment and a non-polarized alignment (or a random state of polarization), respectively. This enables the antiferroelectric layer in the FeFET to provide a sharper/larger voltage drop for an erase operation of the FeFET (e.g., in which the FeFET switches or transitions from the programmed state to the erased state) relative to a ferroelectric material layer that operates based on switching between two opposing fully polarized states.

20 Claims, 30 Drawing Sheets

(56)                    References Cited

U.S. PATENT DOCUMENTS

| 2020/0350324 A1* | 11/2020 | Hoffmann | H10B 53/30 |
|---|---|---|---|
| 2021/0066348 A1* | 3/2021 | Prasad | H10B 51/30 |
| 2022/0093474 A1 | 3/2022 | Mishra et al. | |

* cited by examiner 314
310
312

708  316  314

302

304

300

700

1210 — Form a layer stack that includes a plurality of alternating layers

1220 — Remove one or more portions of the layer stack to form a row stack

1230 — Form an antiferroelectric on a side of the row stack

1240 — Form an oxide semiconductor layer adjacent to the antiferroelectric layer 1250 — Form a plurality of conductive pillars adjacent to the oxide semiconductor layer

1200

ANTIFERROELECTRIC NON-VOLATILE MEMORY

CROSS-REFERENCE TO RELATED APPLICATION

This patent application claims priority to U.S. Provisional Patent Application No. 63/377,493, filed on Sep. 28, 2022, and entitled "ANTIFERROELECTRIC NON-VOLATILE MEMORY." The disclosure of the prior application is considered part of and is incorporated by reference into this patent application.

BACKGROUND

Semiconductor devices are used in a variety of electronic applications, such as personal computers, cell phones, digital cameras, and other electronic equipment. Semiconductor devices are typically fabricated by forming various material layers (e.g., insulating or dielectric layers, conductive layers, and/or semiconductor layers) over a semiconductor substrate and patterning the various material layers using lithography and etching techniques to form circuit components and elements thereon. The semiconductor industry continues to improve the integration density of various electronic components (e.g., transistors, diodes, resistors, capacitors, etc.) by continual reductions in minimum feature size, which allow more components to be integrated into a given area.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-7L are diagrams of an example implementation of forming the non-volatile memory array structure described herein.

DETAILED DESCRIPTION

Figure 1:
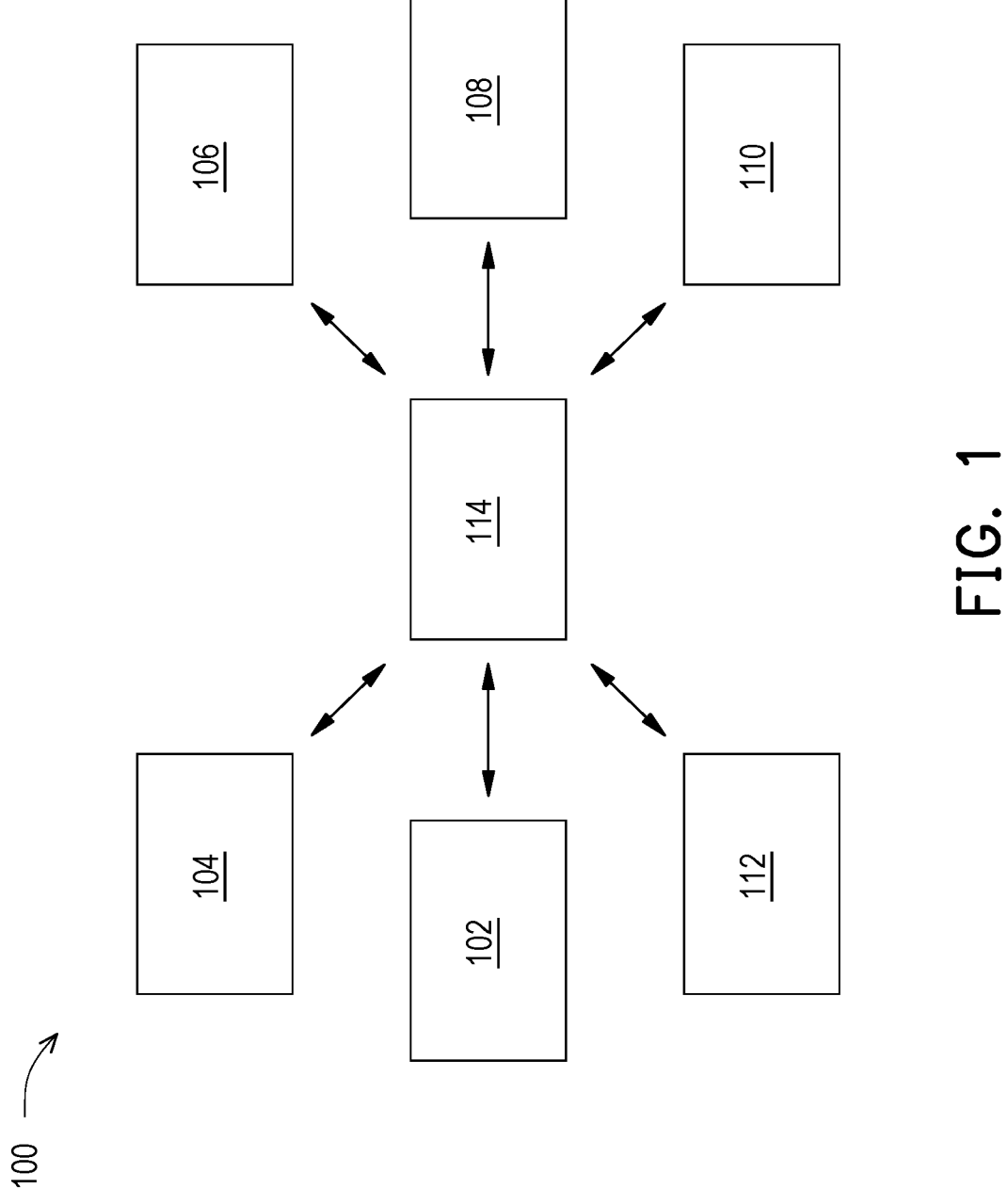
FIG. 1 is a diagram of an example environment in which systems and/or methods described herein may be implemented.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

In some cases, a memory array may include a ferroelectric field effect transistor (FeFET) based memory circuit in which one or more memory cells in the memory array includes an FeFET. A memory cell that includes an FeFET may be referred to as a ferroelectric random access memory (FeRAM) cell. A memory cell that includes an FeFET may include a word line conductive structure, a bit line conductive structure, and a select line (or source line) conductive structure. The word line conductive structure may correspond to a gate electrode of the FeFET, the bit line conductive structure may correspond to a first source/drain electrode of the FeFET, and a select line conductive structure may correspond to a second source/drain electrode of the FeFET.

The FeFET may also include a ferroelectric layer corresponding to a gate dielectric of the FeFET, and an oxide semiconductor (OS) layer corresponding to a channel region of the FeFET. The FeFET may operate based on a polarization of the ferroelectric layer. For example, a first voltage may be applied to the word line conductive structure to cause the ferroelectric layer to be polarized in a first polarization configuration corresponding to a programmed state of the memory cell, and a second voltage may be applied to the word line conductive structure to cause the ferroelectric layer to be polarized in a second polarization configuration corresponding to an erased state of the memory cell. In the first and second polarization configurations, the ferroelectric layer is polarized into a fully polarized alignment having opposing polarization directions.

In some cases, an FeFET in a memory array may be susceptible to an unstable erased state. An unstable erased state may result from a gradual voltage drop in the ferroelectric layer due to the oxide semiconductor layer including primarily n-type carriers (e.g., no p-type carriers). The gradual voltage drop may cause weak dipole switching in the ferroelectric layer, which may result in an inability (or reduced ability) to switch between the programed state and the erased state. Thus, the unstable erased state may result in a need to use an increased negative threshold voltage (V t) to switch to the erased state, which may reduce the size of a memory window of the memory cell (e.g., the difference between the threshold voltages for a program operation and an erase operation for the memory cell). Moreover, the unstable erased state may result in large variations in data stored in the memory array.

In some implementations described herein, an antiferro-electric field effect transistor (Anti-FeFET) of a memory cell includes an antiferroelectric layer instead of a ferroelectric layer. The antiferroelectric layer includes one or more materials having antiferroelectric properties, such as having an ordered (crystalline) array of electric dipoles in which adjacent dipoles are orientated in opposing (antiparallel) directions as opposed to having the dipoles all point in the same direction as in a ferroelectric material. The antiferroelectric layer may operate based on a programmed state and an erased state in which the antiferroelectric layer is in a fully polarized alignment and a non-polarized alignment (or a random state of polarization), respectively. This enables the antiferroelectric layer in the Anti-FeFET to provide a sharper/larger voltage drop for an erase operation of the Anti-FeFET (e.g., in which the Anti-FeFET switches or transitions from the programmed state to the erased state) relative to a ferroelectric material layer that operates based on switching between two opposing fully polarized states. This may reduce variations in data stored in a memory array that includes the memory cell. Moreover, this may provide an increased memory window for the memory cell, which may enable increased control for the memory cell.

FIG. 1 is a diagram of an example environment 100 in which systems and/or methods described herein may be implemented. As shown in FIG. 1, the example environment 100 may include a plurality of semiconductor processing tools 102-112 and a wafer/die transport tool 114. The plurality of semiconductor processing tools 102-112 may include a deposition tool 102, an exposure tool 104, a developer tool 106, an etch tool 108, a planarization tool 110, a plating tool 112, and/or another type of semiconductor processing tool. The tools included in example environment 100 may be included in a semiconductor clean room, a semiconductor foundry, a semiconductor processing facility, and/or manufacturing facility, among other examples.

The deposition tool 102 is a semiconductor processing tool that includes a semiconductor processing chamber and one or more devices capable of depositing various types of materials onto a substrate. In some implementations, the deposition tool 102 includes a spin coating tool that is capable of depositing a photoresist layer on a substrate such as a wafer. In some implementations, the deposition tool 102 includes a chemical vapor deposition (CVD) tool such as a plasma-enhanced CVD (PECVD) tool, a high-density plasma CVD (HDP-CVD) tool, a sub-atmospheric CVD (SACVD) tool, a low-pressure CVD (LPCVD) tool, an atomic layer deposition (ALD) tool, a plasma-enhanced atomic layer deposition (PEALD) tool, or another type of CVD tool. In some implementations, the deposition tool 102 includes a physical vapor deposition (PVD) tool, such as a sputtering tool or another type of PVD tool. In some implementations, the deposition tool 102 includes an epi-taxial tool that is configured to form layers and/or regions of a device by epitaxial growth. In some implementations, the example environment 100 includes a plurality of types of deposition tools 102.

The exposure tool 104 is a semiconductor processing tool that is capable of exposing a photoresist layer to a radiation source, such as an ultraviolet light (UV) source (e.g., a deep UV light source, an extreme UV light (EUV) source, and/or the like), an x-ray source, an electron beam (e-beam) source, and/or the like. The exposure tool 104 may expose a photoresist layer to the radiation source to transfer a pattern from a photomask to the photoresist layer. The pattern may include one or more semiconductor device layer patterns for forming one or more semiconductor devices, may include a pattern for forming one or more structures of a semicon-ductor device, may include a pattern for etching various portions of a semiconductor device, and/or the like. In some implementations, the exposure tool 104 includes a scanner, a stepper, or a similar type of exposure tool.

The developer tool 106 is a semiconductor processing tool that is capable of developing a photoresist layer that has been exposed to a radiation source to develop a pattern transferred to the photoresist layer from the exposure tool 104. In some implementations, the developer tool 106 develops a pattern by removing unexposed portions of a photoresist layer. In some implementations, the developer tool 106 develops a pattern by removing exposed portions of a photoresist layer. In some implementations, the developer tool 106 develops a pattern by dissolving exposed or unex-posed portions of a photoresist layer through the use of a chemical developer.

The etch tool 108 is a semiconductor processing tool that is capable of etching various types of materials of a sub-strate, wafer, or semiconductor device. For example, the etch tool 108 may include a wet etch tool, a dry etch tool, and/or the like. In some implementations, the etch tool 108 includes a chamber that is filled with an etchant, and the substrate is placed in the chamber for a particular time period to remove particular amounts of one or more portions of the substrate. In some implementations, the etch tool 108 may etch one or more portions of the substrate using a plasma etch or a plasma-assisted etch, which may involve using an ionized gas to isotropically or directionally etch the one or more portions.

The planarization tool 110 is a semiconductor processing tool that is capable of polishing or planarizing various layers of a wafer or semiconductor device. For example, a planar-ization tool 110 may include a chemical mechanical planar-ization (CMP) tool and/or another type of planarization tool that polishes or planarizes a layer or surface of deposited or plated material. The planarization tool 110 may polish or planarize a surface of a semiconductor device with a com-bination of chemical and mechanical forces (e.g., chemical etching and free abrasive polishing). The planarization tool 110 may utilize an abrasive and corrosive chemical slurry in conjunction with a polishing pad and retaining ring (e.g., typically of a greater diameter than the semiconductor device). The polishing pad and the semiconductor device may be pressed together by a dynamic polishing head and held in place by the retaining ring. The dynamic polishing head may rotate with different axes of rotation to remove material and even out any irregular topography of the semiconductor device, making the semiconductor device flat or planar.

The plating tool 112 is a semiconductor processing tool that is capable of plating a substrate (e.g., a wafer, a semiconductor device, and/or the like) or a portion thereof with one or more metals. For example, the plating tool 112 may include a copper electroplating device, an aluminum electroplating device, a nickel electroplating device, a tin electroplating device, a compound material or alloy (e.g., tin-silver, tin-lead, and/or the like) electroplating device, and/or an electroplating device for one or more other types of conductive materials, metals, and/or similar types of materials.

Wafer/die transport tool 114 includes a mobile robot, a robot arm, a tram or rail car, an overhead hoist transport (OHT) system, an automated materially handling system (AMHS), and/or another type of device that is configured to transport substrates and/or semiconductor devices between semiconductor processing tools 102-112, that is configured to transport substrates and/or semiconductor devices between processing chambers of the same semiconductor processing tool, and/or that is configured to transport substrates and/or semiconductor devices to and from other locations such as a wafer rack, a storage room, and/or the like. In some implementations, wafer/die transport tool 114 may be a programmed device that is configured to travel a particular path and/or may operate semi-autonomously or autonomously. In some implementations, the example environment 100 includes a plurality of wafer/die transport tools 114.

For example, the wafer/die transport tool 114 may be included in a cluster tool or another type of tool that includes a plurality of processing chambers, and may be configured to transport substrates and/or semiconductor devices between the plurality of processing chambers, to transport substrates and/or semiconductor devices between a processing chamber and a buffer area, to transport substrates and/or semiconductor devices between a processing chamber and an interface tool such as an equipment front end module (EFEM), and/or to transport substrates and/or semiconductor devices between a processing chamber and a transport carrier (e.g., a front opening unified pod (FOUP)), among other examples. In some implementations, a wafer/die transport tool 114 may be included in a multi-chamber (or cluster) deposition tool 102, which may include a pre-clean processing chamber (e.g., for cleaning or removing oxides, oxidation, and/or other types of contamination or byproducts from a substrate and/or semiconductor device) and a plurality of types of deposition processing chambers (e.g., processing chambers for depositing different types of materials, processing chambers for performing different types of deposition operations). In these implementations, the wafer/die transport tool 114 is configured to transport substrates and/or semiconductor devices between the processing chambers of the deposition tool 102 without breaking or removing a vacuum (or an at least partial vacuum) between the processing chambers and/or between processing operations in the deposition tool 102, as described herein.

In some implementations, one or more of the semiconductor processing tools 102-112 and/or the wafer/die transport tool 114 may perform one or more semiconductor processing operations described herein. For example, one or more of the semiconductor processing tools 102-112 and/or the wafer/die transport tool 114 may form a layer stack that comprises a plurality of alternating layers, where the plurality of alternating layers include a plurality of conductive layers and a plurality of isolation layers; may remove one or more portions of the layer stack to form a row stack; may form antiferroelectric layers on opposing sides of the row stack; may form an oxide semiconductor layer adjacent to an antiferroelectric layer of the antiferroelectric layers; and/or may form a plurality of conductive pillars (e.g., bit line conductive structures 306, select line conductive structures 308) adjacent to the oxide semiconductor layer.

The number and arrangement of devices shown in FIG. 1 are provided as one or more examples. In practice, there may be additional devices, fewer devices, different devices, or differently arranged devices than those shown in FIG. 1. Furthermore, two or more devices shown in FIG. 1 may be implemented within a single device, or a single device shown in FIG. 1 may be implemented as multiple, distributed devices. Additionally, or alternatively, a set of devices (e.g., one or more devices) of the example environment 100 may perform one or more functions described as being performed by another set of devices of the example environment 100.

Figure 2:
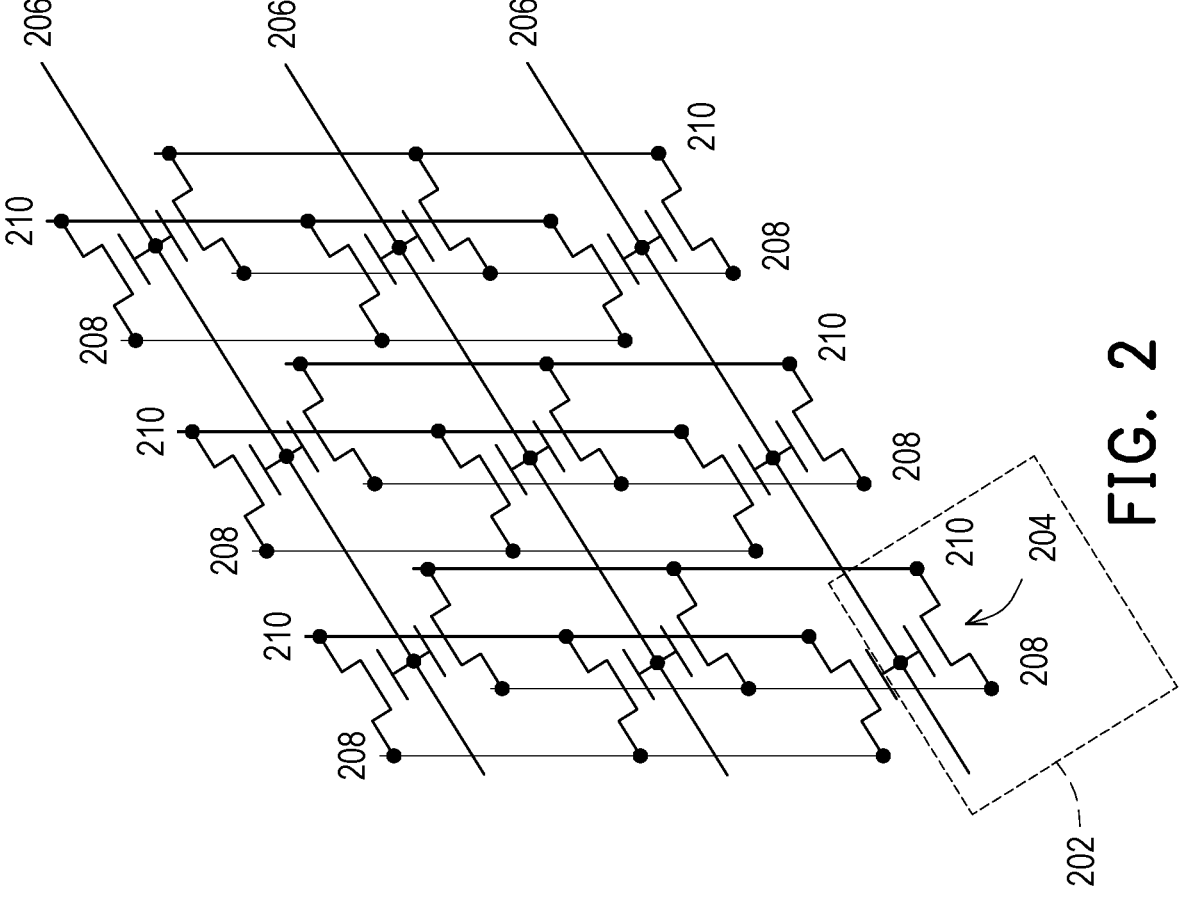
FIG. 2 is a diagram of an example non-volatile memory array circuit described herein.

FIG. 2 is a diagram of an example non-volatile memory array circuit 200 described herein. In some implementations, the non-volatile memory (NVM) array circuit 200 includes a non-volatile RAM array circuit. In some implementations, the non-volatile memory array circuit 200 includes an antiferroelectric random access memory (Anti-FeRAM) array circuit.

As shown in FIG. 2, the non-volatile memory array circuit 200 may include a plurality of non-volatile memory cells 202 that are electrically connected in a grid of rows and columns. The non-volatile memory cells 202 may include NVM cells. In particular, the non-volatile memory cells 202 may include Anti-FeFET cells. Therefore, the non-volatile memory cells 200 may be referred to as antiferroelectric non-volatile memory cells.

Each non-volatile memory cell 202 may include an Anti-FeFET 204, which is a type of transistor that includes an antiferroelectric layer. The Anti-FeFET 204 of a non-volatile memory cell 202 may include a gate that is electrically connected with a word line 206, a source/drain that is electrically connected with a bit line 208, and another source/drain that is electrically connected with a select line 210. A source/drain may refer to a source or a drain, individually or collectively dependent upon the context. Gates of a plurality of non-volatile memory cells 202 in a row may be connected to the same word line 206. Source/drains of a plurality of non-volatile memory cells 202 in a column may be connected to the same bit line 208. Source/drains of a plurality of non-volatile memory cells 202 in a column may be connected to the same select line 210.

The non-volatile memory cells 202 of the non-volatile memory array circuit 200 may be connected to other circuits in a memory device, such as sense amplifier circuits, row decoder circuits, column decoder circuits, and/or address decoder circuits, among other examples.

As indicated above, FIG. 2 is provided as an example. Other examples may differ from what is described with regard to FIG. 2.

FIGS. 3A-3E are diagrams of an example non-volatile memory array structure 300 described herein. The non-volatile memory array circuit 200, or a portion thereof, may be physically implemented as the non-volatile memory array structure 300. Accordingly, the non-volatile memory array structure 300 includes an antiferroelectric memory array structure or an Anti-FeRAM array structure that includes a plurality of non-volatile memory cell structures (e.g., Anti-FeFET cell structures).

Figure 3A:
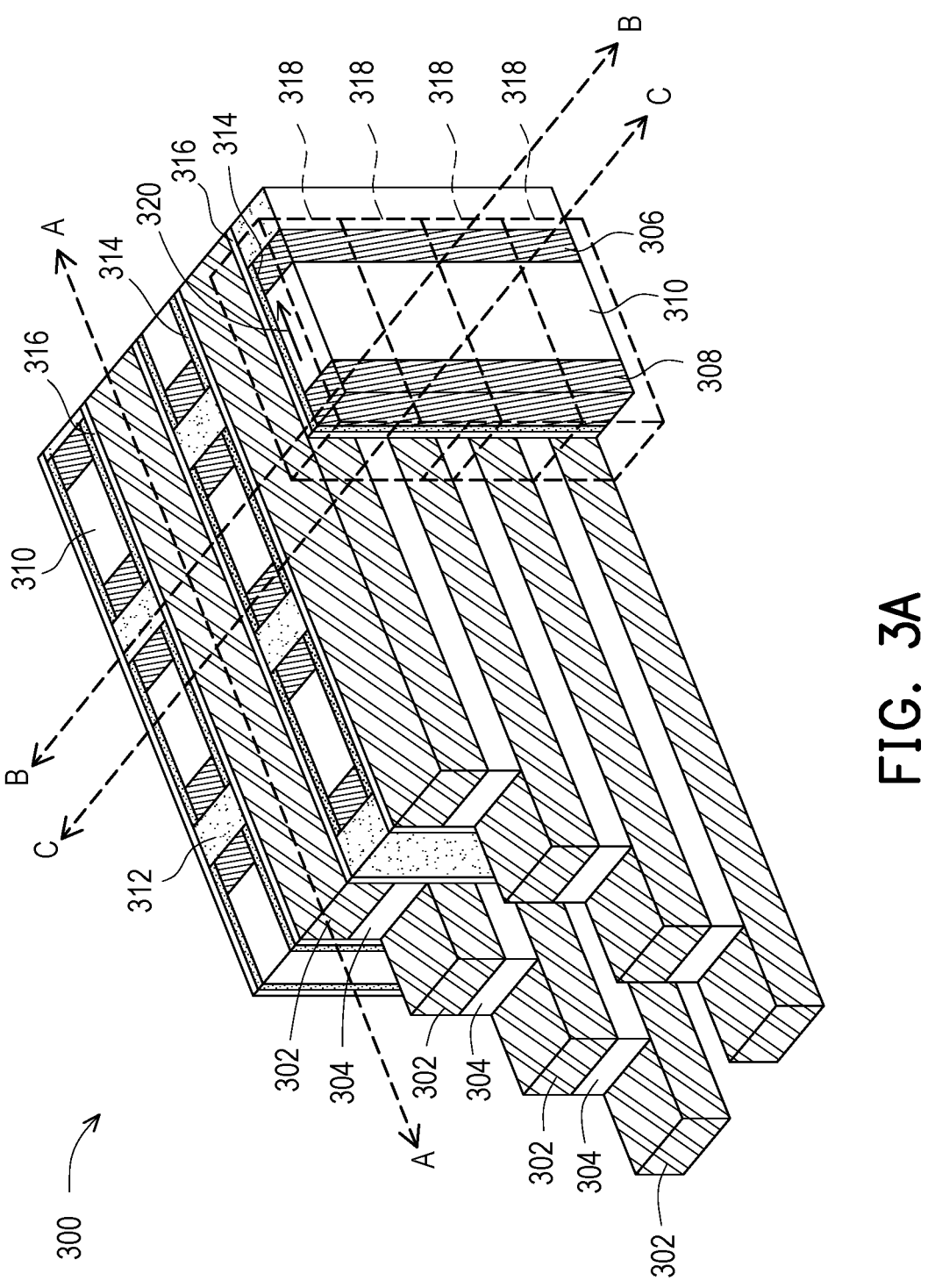
FIGS. 3A-3E are diagrams of an example non-volatile memory array structure described herein.

FIG. 3A is a diagram of a perspective view of the non-volatile memory array structure 300. As shown in FIG. 3A, the non-volatile memory array structure 300 includes a plurality of vertically stacked structures that are arranged in an alternating manner. The vertically stacked structures include a plurality of word line conductive structures 302 that alternate with a plurality of isolation layers 304. The word line conductive structures 302 correspond to the word lines 206 of the non-volatile memory array circuit 200. The word line conductive structures 302 extend in a direction that is approximately parallel with a surface of an underlying substrate (not shown). The word line conductive structures 302 may have a staircase configuration such that lower word line conductive structures 302 are longer than and extend laterally past endpoints of upper word line conductive structures 302. For example, the topmost word line conductive structures 302 may be the shortest of the word line conductive structures 302, and the bottommost word line conductive structures 302 may be the longest of the word line conductive structures 302. Respective lengths of the word line conductive structures 302 may increase in a direction towards the underlying substrate. In this manner, a portion of each of the word line conductive structures 302 may be accessible from above in the non-volatile memory array structure 300, and conductive contacts may be made to contact exposed portions of the word line conductive structures 302, respectively.

The word line conductive structures 302 may include metallization layers, trenches, vias, and/or another type of conductive structures. The word line conductive structures 302 may each include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples. The isolation layers 304 may each include one or more dielectric materials, such as an oxide, a nitride, a silicon oxide ($SiO_x$), a silicon nitride ($Si_xN_y$), a silicon oxynitride (SiON), fluoride-doped silicate glass (FSG), a low-k dielectric material, and/or another suitable electrically insulating material.

The non-volatile memory array structure 300 further includes bit line conductive structures 306 and select line conductive structures 308 adjacent to one or more sides of the word line conductive structures 302. The bit line conductive structures 306 and the select line conductive structures 308 may be arranged in an alternating manner in which the bit line conductive structures 306 and the select line conductive structures 308 alternate along the length of the word line conductive structures 302. The bit line conductive structures 306 and the select line conductive structures 308 may each include conductive pillars, vias, and/or another type of elongated conductive structures that extend in a direction that is approximately perpendicular with the word line conductive structures 302. The bit line conductive structures 306 and the select line conductive structures 308 may each include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), silver (Ag), titanium nitride (TiN), and/or tantalum nitride (TaN), among other examples.

Isolation regions 310 are included between and electrically isolate pairs of adjacent bit line conductive structures 306 and select line conductive structures 308 that are included in the same memory cell. Isolation pillars 312 are included between and electrically isolate pairs of adjacent bit line conductive structures 306 and select line conductive structures 308 that are included in different (adjacent) memory cells. The isolation regions 310 and the isolation pillars 312 may each include an oxide material such as a silicon oxide ($SiO_x$). Additionally, and/or alternatively, the isolation regions 310 and the isolation pillars 312 may each include one or more other types of dielectric materials and/or insulating materials, such as a nitride, a silicon nitride ($Si_xN_y$), a silicon oxynitride (SiON), fluoride-doped silicate glass (FSG), a low-k dielectric material, and/or another suitable electrically insulating material. The isolation regions 310 may also be referred to as insulating regions or dielectric regions, among other examples. The isolation pillars 312 may be referred to as insulating pillars or dielectric pillars, among other examples.

The non-volatile memory array structure 300 may also include oxide semiconductor (OS) layers 314. The oxide semiconductor layers 314 may be included along sides of the bit line conductive structures 306, may be included along sides of the select line conductive structures 308, and may be included along sides of the isolation regions 310. Thus, the oxide semiconductor layers 314 may extend between the bit line conductive structures 306 and the select line conductive structures 308. The oxide semiconductor layers 314 may be configured as channel layers for the non-volatile memory cell structures of the non-volatile memory array structure 300. The oxide semiconductor layer 314 may provide channel layers for the non-volatile memory cell structures of the non-volatile memory array structure 300. For example, when a voltage that satisfies a threshold (e.g., a voltage that is greater relative to a threshold voltage ($V_{th}$)) is applied through a word line conductive structure 302, a conductive path through a region of a corresponding oxide semiconductor layer 314 may be formed.

The oxide semiconductor layers 314 may each include one or more oxide semiconductor materials. Examples of oxide semiconductor materials include zinc oxide (ZnO), indium tungsten oxide (InWO or IWO), indium gallium zinc oxide (InGaZnO), indium zinc oxide (InZnO), and/or indium tin oxide (InTiO or ITO), among other examples. In some implementations, the thickness of an oxide semiconductor layer 314 may be included in a range of approximately 2 nanometers to approximately 20 nanometers. However, other values for the range are within the scope of the present disclosure.

As further shown in FIG. 3A, an antiferroelectric layer 316 is included between the oxide semiconductor layers 314 and each of the word line conductive structures 302 and the isolation layers 304 of the non-volatile memory array structure 300. The antiferroelectric layer 316 may be configured to function as a gate dielectric for the non-volatile memory cell structures of the non-volatile memory array structure 300. In some implementations, an antiferroelectric layer 316 continuously extends past multiple ones of the word line conductive structures 302 and/or multiple ones of the isolation layers 304 in a same vertical stack.

The antiferroelectric layers 316 each includes one or more antiferroelectric materials. The antiferroelectric materials have antiferroelectric properties, such as having an ordered (crystalline) array of electric dipoles in which adjacent dipoles are orientated in opposing (antiparallel) directions as opposed to having the dipoles all point in the same direction as in a ferroelectric material. The antiferroelectric properties of the antiferroelectric layers 316 may enable the non-volatile memory cell structures of the non-volatile memory array structure 300 to operate based on a programmed state and an erased state in which the antiferroelectric layers 316 are in a fully polarized alignment and in a non-polarized alignment (or a random state of polarization), respectively.

The antiferroelectric layers 316 may include a combination of hafnium (Hf) and at least one of aluminum (Al), lanthanum (La), cerium (Ce), gadolinium (Gd), and/or silicon (Si), among other examples. In particular, antiferroelectric layers 316 may include an oxide material that includes a combination of hafnium (Hf) and at least one of aluminum (Al), lanthanum (La), cerium (Ce), gadolinium (Gd), and/or silicon (Si), among other examples. Examples of antiferroelectric materials include hafnium zirconium oxide (HfZrO), hafnium aluminum oxide (HfAlO), hafnium cerium oxide (HfCeO), hafnium oxide (HfO), hafnium gadolinium oxide (HfGdO), and/or hafnium silicon oxide (HfSiO), among other examples. In some implementations, the thickness of an antiferroelectric layer 316 may be included in a range of approximately 2 nanometers to approximately 20 nanometers to provide sufficient electrical isolation and to reduce the likelihood of leakage while enabling efficient electrical operation of the non-volatile memory cell structures of the non-volatile memory array structure 300. However, other values for the range are within the scope of the present disclosure.

In implementations in which an antiferroelectric layer 316 includes hafnium zirconium oxide (HfZrO), the concentration of zirconium in the antiferroelectric layer 316 may be greater relative to the concentration of hafnium in the antiferroelectric layer 316 to enable the antiferroelectric layer 316 to exhibit antiferroelectric properties. For example, the concentration of hafnium in the antiferroelectric layer 316 may be included in a range of approximately 20% to approximately 50%, whereas the concentration of zirconium in the antiferroelectric layer 316 may be included in a range of approximately 50% to approximately 80% to enable the antiferroelectric layer 316 to exhibit antiferroelectric properties. In particular, including a concentration of zirconium in a range of approximately 50% to approximately 80% may increase the tetragonal phase (T-phase) ratio in the crystalline film of the antiferroelectric layer 316, which may cause the antiferroelectric layer 316 to exhibit antiferroelectric properties. Moreover, including a concentration of zirconium in a range of approximately 50% to approximately 80% may decrease the orthorhombic phase (O-phase) ratio in the crystalline film of the antiferroelectric layer 316, which may reduce the ferroelectric behavior of the antiferroelectric layer 316. However, other values for these ranges are within the scope of the present disclosure. In some implementations, the T-phase percentage in the antiferroelectric layer 316 may be included in a range of approximately 2% to approximately 14%. In some implementations, the 0-phase percentage in the antiferroelectric layer 316 may be included in a range of approximately 84% to approximately 87%. In some implementations, the monoclinic (M-phase) percentage in the antiferroelectric layer 316 may be included in a range of approximately 2% to approximately 11%.

As further shown in FIG. 3A, the non-volatile memory array structure 300 may include a plurality of non-volatile memory cell structures 318. Each non-volatile memory cell structure 318 may include an Anti-FeFET and may therefore be referred to as an antiferroelectric memory cell, an antiferroelectric non-volatile memory cell, and/or an Anti-Fe-RAM cell.

A non-volatile memory cell structure 318 may include a bit line conductive structure 306 (or a portion thereof) corresponding to a source/drain region of the Anti-FeFET. The non-volatile memory cell structure 318 may include a select line conductive structure 308 (or a portion thereof) corresponding to another source/drain region of the Anti-FET. The non-volatile memory cell structure 318 may include an isolation region 310 (or a portion thereof) between the bit line conductive structure 306 and the select line conductive structure 308. The non-volatile memory cell structure 318 may include an oxide semiconductor layer 314 (or a portion thereof) adjacent to the isolation region 310 and extending between the bit line conductive structure 306 and the select line conductive structure 308. The oxide semiconductor layer 314 may correspond to the channel layer of the Anti-FeFET. A current flow path 320 from the select line conductive structure 308 to the bit line conductive structure 306 through the oxide semiconductor layer 314 is illustrated in FIG. 3A. However, in some implementations, the current flow path 320 may be in the opposing direction from the bit line conductive structure 306 to the select line conductive structure 308 through the oxide semiconductor layer 314.

The non-volatile memory cell structure 318 may include an antiferroelectric layer 316 (or a portion thereof) adjacent to the oxide semiconductor layer 314 (e.g., adjacent to the channel layer). The oxide semiconductor layer 314 (e.g., the channel layer) is between the antiferroelectric layer 316 and the bit line conductive structure 306. Moreover, the oxide semiconductor layer 314 (e.g., the channel layer) is between the antiferroelectric layer 316 and the select line conductive structure 308. The non-volatile memory cell structure 318 may include a word line conductive structure 302 (or a portion thereof) adjacent to the antiferroelectric layer 316. The antiferroelectric layer 316 is between the word line conductive structure 302 and the oxide semiconductor layer 314 (e.g., the channel layer).

Accordingly, the non-volatile memory array structure 300 includes a plurality of word line conductive structures 302 that are arranged in a first direction. The non-volatile memory array structure 300 includes a plurality of bit line conductive structures 306 and a plurality of select line conductive structures 308 that are arranged in a second direction that is approximately perpendicular to the first direction. The non-volatile memory array structure 300 includes an antiferroelectric layer 316 between the plurality of word line conductive structures 302 and the plurality of bit line conductive structures 306, and between the plurality of word line conductive structures and 302 the plurality of select line conductive structures 308. The non-volatile memory array structure 300 includes a plurality of oxide semiconductor layers 314 between the antiferroelectric layer 316 and the plurality of bit line conductive structures 306, and between the antiferroelectric layer 316 and the plurality of select line conductive structures 308.

Figure 3B:
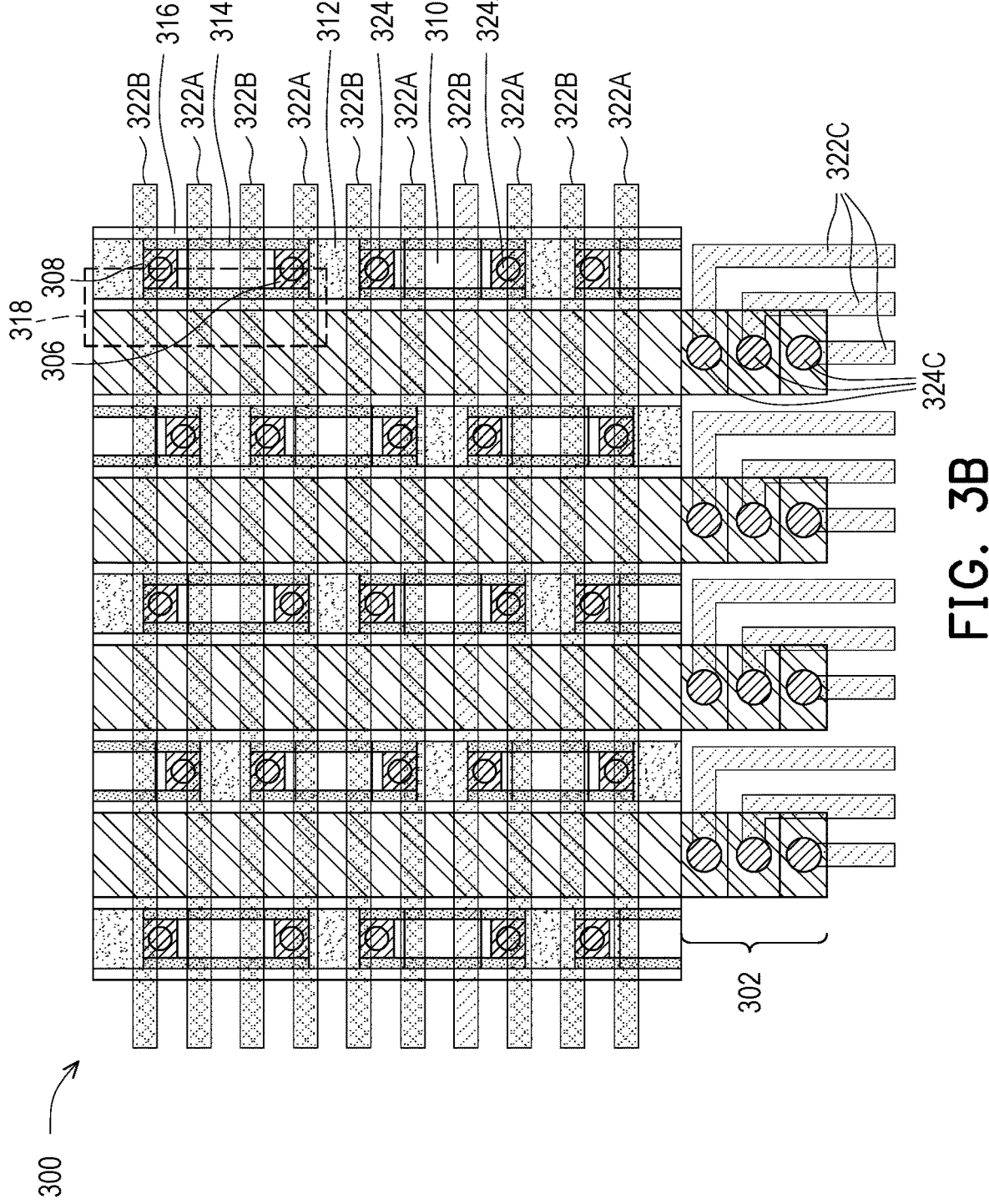

FIG. 3B illustrates a top view of the non-volatile memory array structure 300. FIG. 3B illustrates additional structures and/or layers that may be connected to the non-volatile memory array structure 300 to electrically connect the non-volatile memory array structure 300 to other circuits of a semiconductor device such as a memory device or a logic device, among other examples.

As shown in FIG. 3B, a plurality of conductive lines 322A, a plurality of conductive lines 322B, and a plurality of conductive lines 322C may be included above and/or over the non-volatile memory array structure 300. In some implementations, the plurality of conductive lines 322A, the plurality of conductive lines 322B, and/or the plurality of conductive lines 322C may extend in a direction that is approximately perpendicular to the word line conductive structures 302. Alternatively, the plurality of conductive lines 322A, the plurality of conductive lines 322B, and/or the plurality of conductive lines 322C may extend in a direction that is approximately parallel with the word line conductive structures 302.

As further shown in FIG. 3B, the plurality of conductive lines 322B may be electrically connected with the bit line conductive structures 306 through vias 324A. The plurality of conductive lines 322A may be electrically connected with the select line conductive structures 308 through vias 324B. The plurality of conductive lines 322C may be electrically connected with the word line conductive structures 302 through vias 324C.

The conductive lines 322A, 322B, and 322C; and the vias 324A, 324B, and 324C may each include one or more conductive materials, such as one or more metals, one or more metal alloys, and/or one or more other types of conductive materials. Examples include copper (Cu), cobalt (Co), ruthenium (Ru), titanium (Ti), tungsten (W), gold (Au), and/or silver (Ag), among other examples.

Figure 3C:
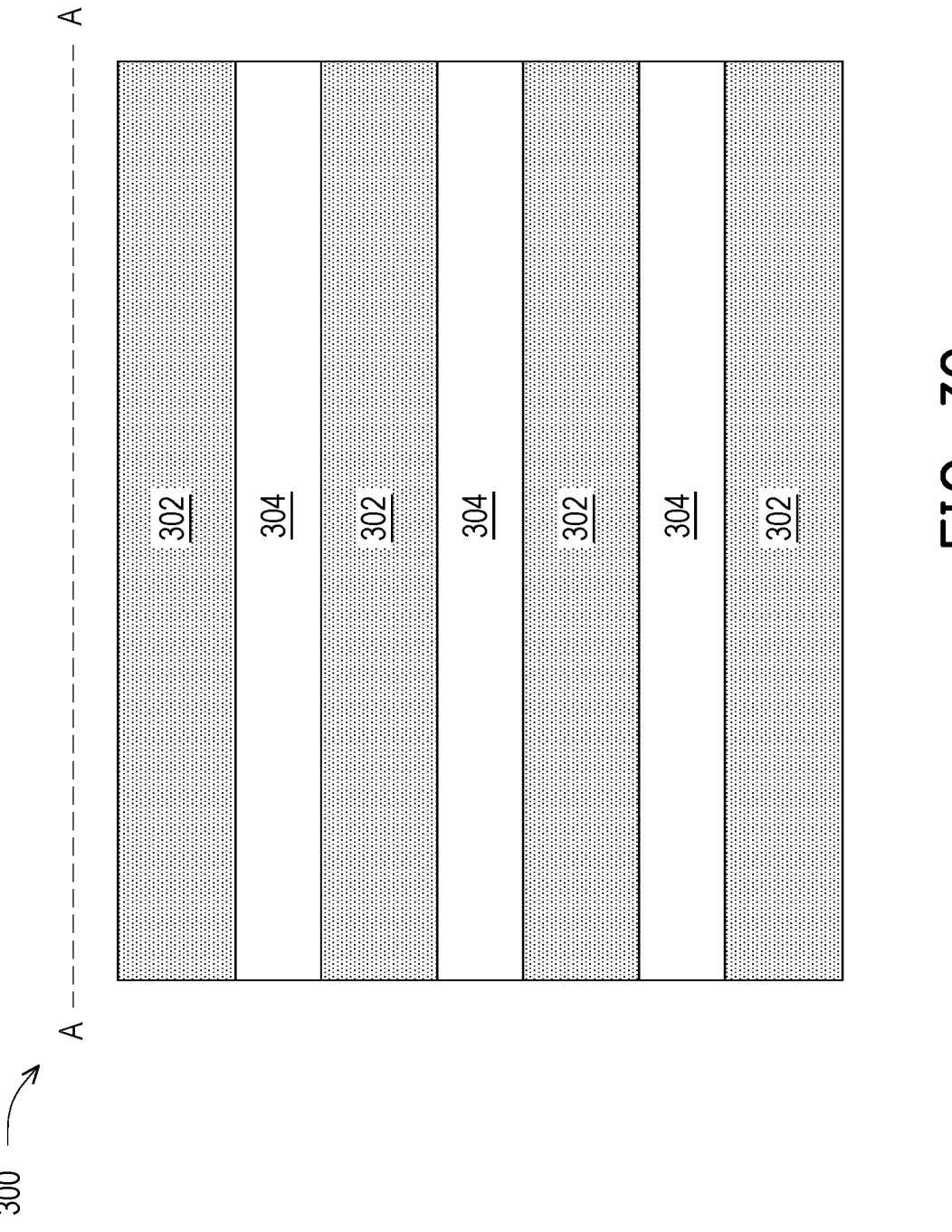

FIG. 3C illustrates a cross-sectional view of the non-volatile memory array structure 300 along line A-A in FIG. 3A. As shown in FIG. 3C, the plurality of vertically stacked structures that are arranged in an alternating manner may include a plurality of word line conductive structures 302 that alternate with a plurality of isolation layers 304. In some implementations, the thickness of the word line conductive structures 302 may be greater relative to the thickness of the isolation layers 304. In some implementations, the thickness of the word line conductive structures 302 and the thickness of the isolation layers 304 may be approximately the same thickness. In some implementations, the thickness of the isolation layers 304 may be greater relative to the thickness of the word line conductive structures 302.

Figure 3D:
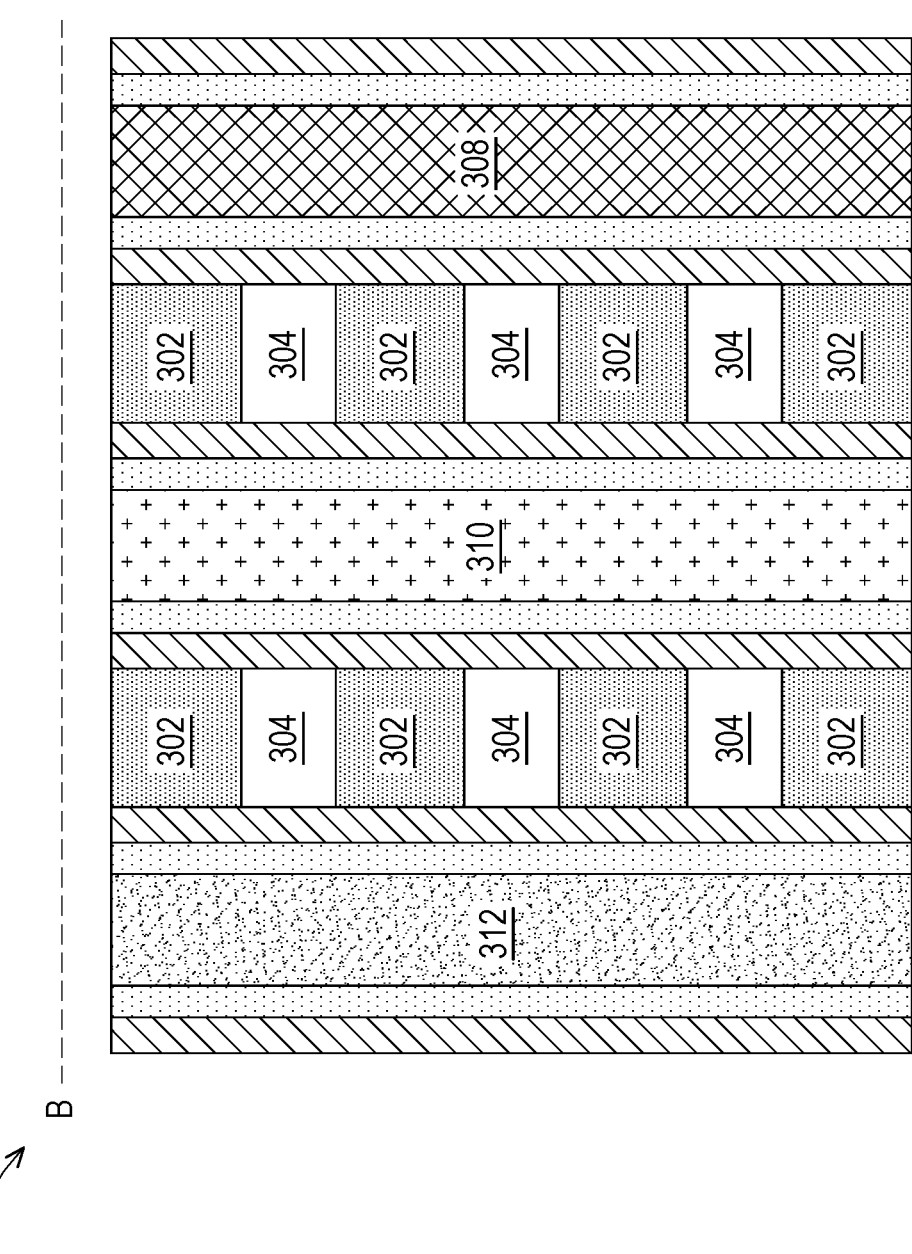
Figure 3E:
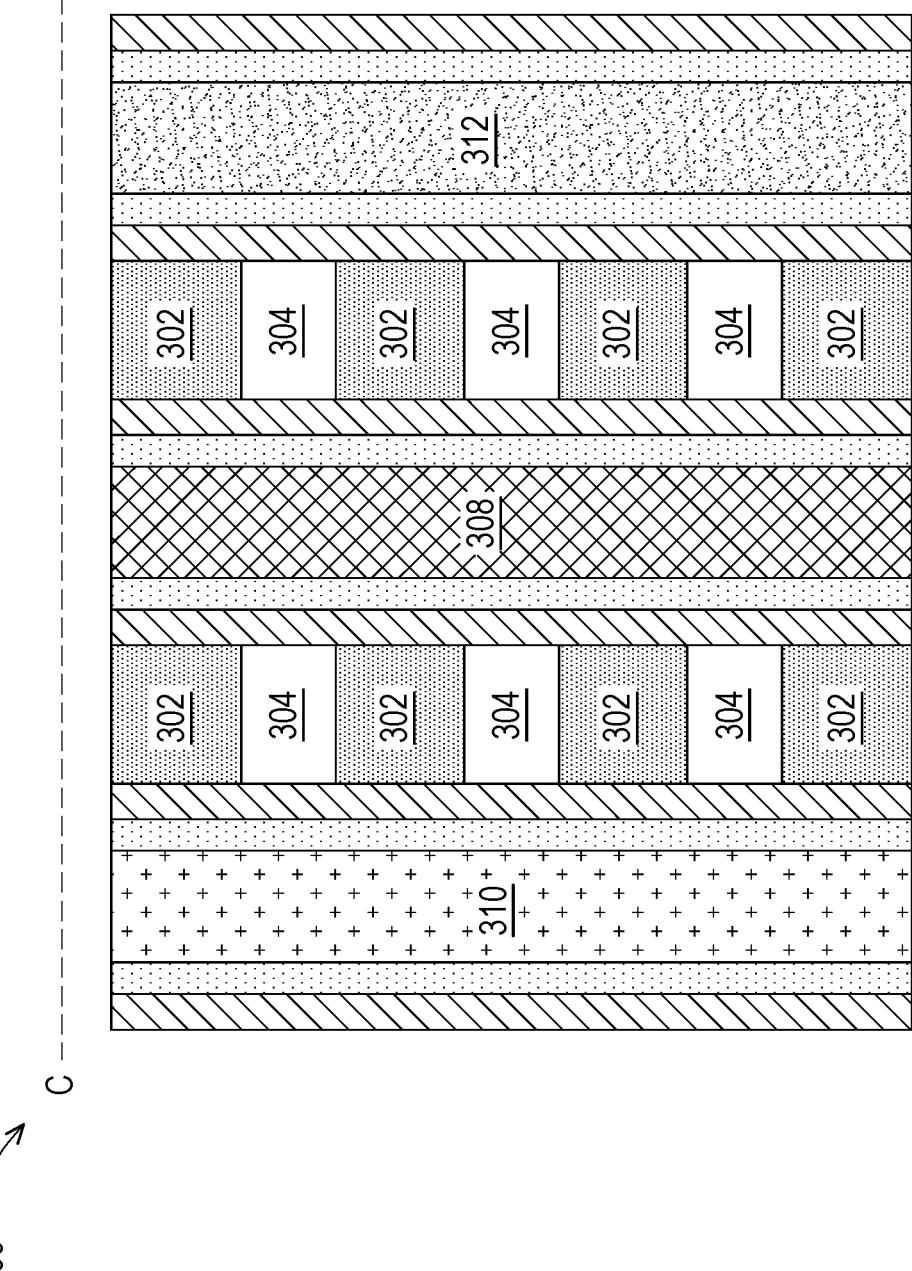

FIGS. 3D and 3E illustrate cross-sectional views of the non-volatile memory array structure 300 along lines B-B and C-C, respectively, in FIG. 3A. As shown in FIGS. 3D and 3E, in some implementations, the structures and/or layers between alternating layers of word line conductive structures 302 and isolation layers 304 may be staggered along the direction of the word line conductive structures 302 and the isolation layers 304. For example, the select line conductive structures 308 on opposing sides of a vertical stack of word line conductive structures 302 and isolation layers 304 may be staggered such that a select line conductive structure 308 and an isolation region 310 are visible on opposing sides of a vertical stack of word line conductive structures 302 and isolation layers 304 in the cross-sectional view along the line B-B in FIG. 3D. As another example, the select line conductive structures 308 on opposing sides of a vertical stack of word line conductive structures 302 and isolation layers 304 may be staggered such that an isolation region 310 and an isolation pillar 312 are visible on opposing sides of a vertical stack of word line conductive structures 302 and isolation layers 304 in the cross-sectional view along the line B-B in FIG. 3D.

As another example, the select line conductive structures 308 on opposing sides of a vertical stack of word line conductive structures 302 and isolation layers 304 may be staggered such that a select line conductive structure 308 and an isolation region 310 are visible on opposing sides of a vertical stack of word line conductive structures 302 and isolation layers 304 in the cross-sectional view along the line C-C in FIG. 3E. As another example, the bit line conductive structures 306 on opposing sides of a vertical stack of word line conductive structures 302 and isolation layers 304 may be staggered such that an isolation region 310 and an isolation pillar 312 are visible on opposing sides of a vertical stack of word line conductive structures 302 and isolation layers 304 in the cross-sectional view along the line C-C in FIG. 3E.

The staggering described above may enable the bit line conductive structures 306 to be connected to different conductive lines 322B above the non-volatile memory array structure 300, and may enable two or more select line conductive structures 308 to be connected to different conductive lines 322A above the non-volatile memory array structure 300. This enables the grid of rows and columns of the non-volatile memory cell structures 318 to be formed in the non-volatile memory array structure 300.

As indicated above, FIGS. 3A-3E are provided as examples. Other examples may differ from what is described with regard to FIGS. 3A-3E.

Figure 4A:
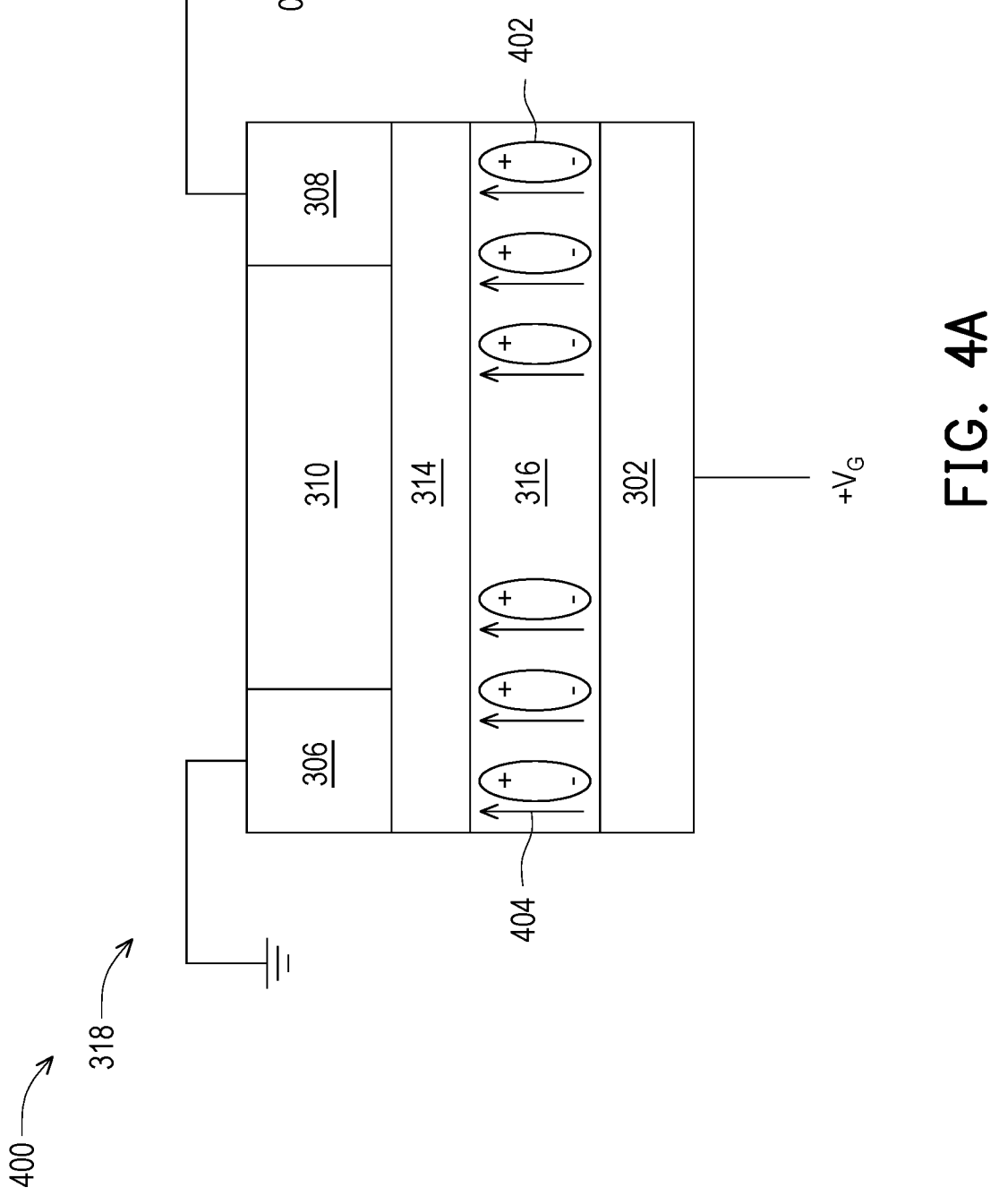
FIGS. 4A and 4B are diagrams of example implementations of memory cell states of a non-volatile memory cell structure described herein.
Figure 4B:
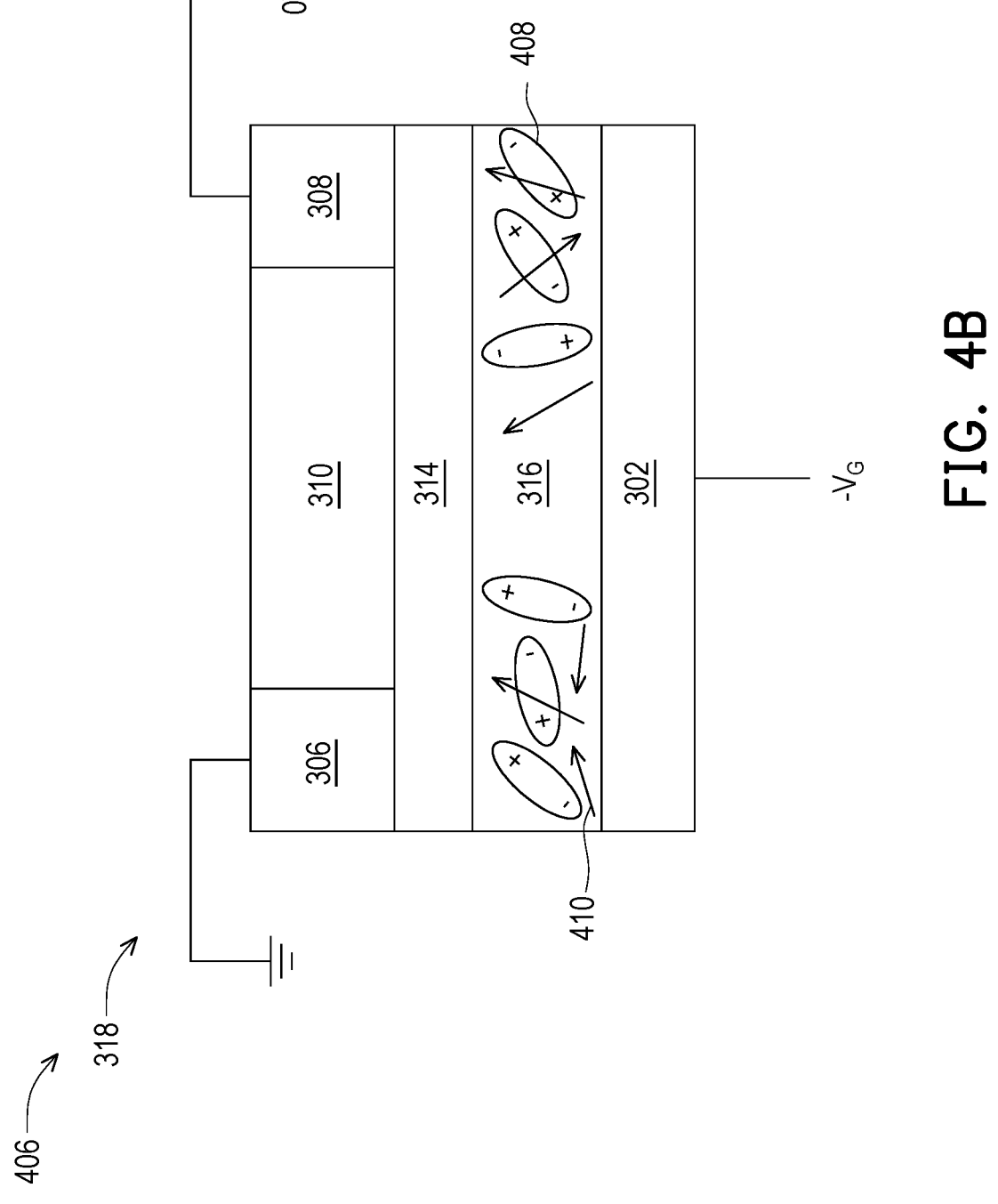

FIGS. 4A and 4B are diagrams of example implementations of memory cell states of a non-volatile memory cell structure 318 described herein. The non-volatile memory cell structure 318 is configured to selectively transition between the memory cell states during operation of the non-volatile memory cell structure 318.

FIG. 4A illustrates an example implementation of a programmed state 400. In the programmed state 400, the antiferroelectric layer 316 of the non-volatile memory cell structure 318 includes electron/hole pairs 402 that are arranged in a particular polarization alignment 404. In particular, the polarization alignment 404 of the electron/hole pairs 402 in the antiferroelectric layer 316 is a fully polarized alignment. This means that the electron/hole pairs 402 in the antiferroelectric layer 316 are aligned along one polarization direction (e.g., away from the word line conductive structure 302).

To transition the non-volatile memory cell structure 318 to the programmed state 400, a positive gate voltage ($+V_G$) is applied to the word line conductive structure 302. This causes the electron charge carriers in the electron/hole pairs 402 to be biased toward the word line conductive structure 302. A 0 voltage (0V) may be applied to the select line conductive structure 308, and the bit line conductive structure 306 may be grounded. This causes the channel layer (e.g., the oxide semiconductor layer 314) of the non-volatile memory cell structure 318 to be in a non-conductive state, thereby causing the hole charge carriers in the electron/hole pairs 402 to be biased toward the channel layer (e.g., the oxide semiconductor layer 314).

FIG. 4B illustrates an example implementation of an erased state 406. In the erased state 406, the antiferroelectric layer 316 of the non-volatile memory cell structure 318 includes electron/hole pairs 408 that are arranged in no particular polarization alignment 410. In other words, the polarization alignment 410 of the electron/hole pairs 408 in the antiferroelectric layer 316 have a random polarization alignment (or a non-polarized alignment). This means that the electron/hole pairs 408 in the antiferroelectric layer 316 are not aligned along and particular polarization direction.

To transition the non-volatile memory cell structure 318 to the erased state 406, a small negative gate voltage ($-V_G$ in a range of greater than 0 volts to approximately 2 volts, for example) is applied to the word line conductive structure 302. A 0 voltage (0V) may be applied to the select line conductive structure 308, and the bit line conductive structure 306 may be grounded. This causes the channel layer (e.g., the oxide semiconductor layer 314) of the non-volatile memory cell structure 318 to be in a non-conductive state. The combination of the small negative voltage on the word line conductive structure 302 and the channel layer being non-conductive causes the electron charge carriers and the hole charge carriers in the electron/hole pairs 408 to randomly align in the antiferroelectric layer 316.

As indicated above, FIGS. 4A and 4B are provided as examples. Other examples may differ from what is described with regard to FIGS. 4A and 4B.

Figure 5A:
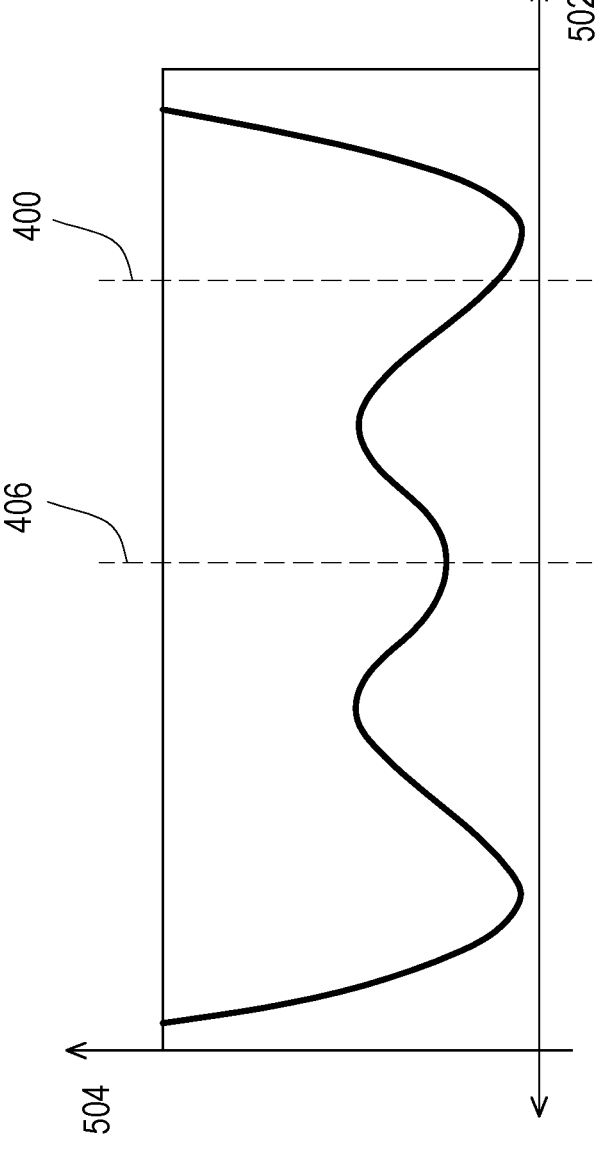
FIGS. 5A and 5B are diagrams of example implementations of operational properties of a non-volatile memory cell structure described herein.
Figure 5B:
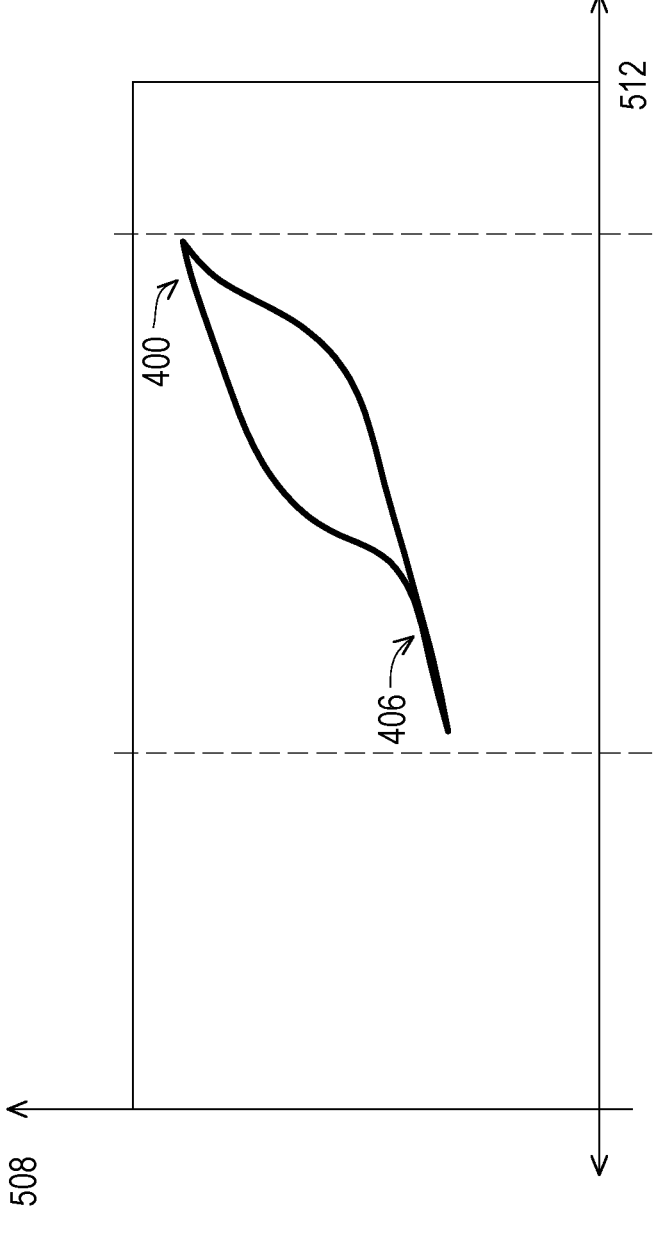

FIGS. 5A and 5B are diagrams of example implementations of operational properties of a non-volatile memory cell structure 318 described herein. The non-volatile memory cell structure 318 is configured to selectively transition between the programmed state 400 and the erased state 406 during operation of the non-volatile memory cell structure 318.

FIG. 5A illustrates an example implementation 500 of changes in polarization direction 502 in an antiferroelectric layer 316 of the non-volatile memory cell structure 318 as a function of energy 504. In other words, the example implementation 500 illustrates the energy level needed to change the polarization direction 502 of the antiferroelectric layer 316 of the non-volatile memory cell structure 318.

As shown in FIG. 5A, the polarization of the antiferroelectric layer 316 when the non-volatile memory cell structure 318 is in the erased state 406 is at or near a centralized polarization direction 502, meaning that the polarization of the antiferroelectric layer 316 is random or non-polarized.

As further illustrated in FIG. 5A, the energy levels in the programmed state 400 and in the erased state 406 is relatively low, and the energy 504 needed to change the polarization direction 502 of the antiferroelectric layer 316 to transition between the programmed state 400 and the erased state 406 is also relatively low (e.g., relative to transitioning between opposing fully polarized alignments in a ferroelectric layer). This is due to the drop in energy 504 at or near the centralized polarization direction 502, which does not occur in a ferroelectric material. In a ferroelectric material, the energy 504 at or near the centralized polarization direction 502 is even higher than the transition between programmed and erased states. This means that the transition between programmed and erased states in a ferroelectric material is more difficult to achieve relative to the programmed state 400 and in the erased state 406 in the antiferroelectric layer 316.

FIG. 5B, illustrates an example implementation 506 of a hysteresis loop showing hysteresis of polarization 508 across the operating range of a gate voltage 512 of the non-volatile memory cell structure 318. As shown in FIG. 5B, the polarization 508 drops off quickly near the erased state 406 of the non-volatile memory cell structure 318, which indicates less hysteresis near the erased state 406. This indicates that the non-volatile memory cell structure 318 exhibits a strong and stable erase operation. This is in contrast to a more drawn out drop in polarization for a non-volatile memory cell structure that includes ferroelectric layer, which would otherwise indicate a weak erase operation.

As indicated above, FIGS. 5A and 5B are provided as examples. Other examples may differ from what is described with regard to FIGS. 5A and 5B.

Figure 6:
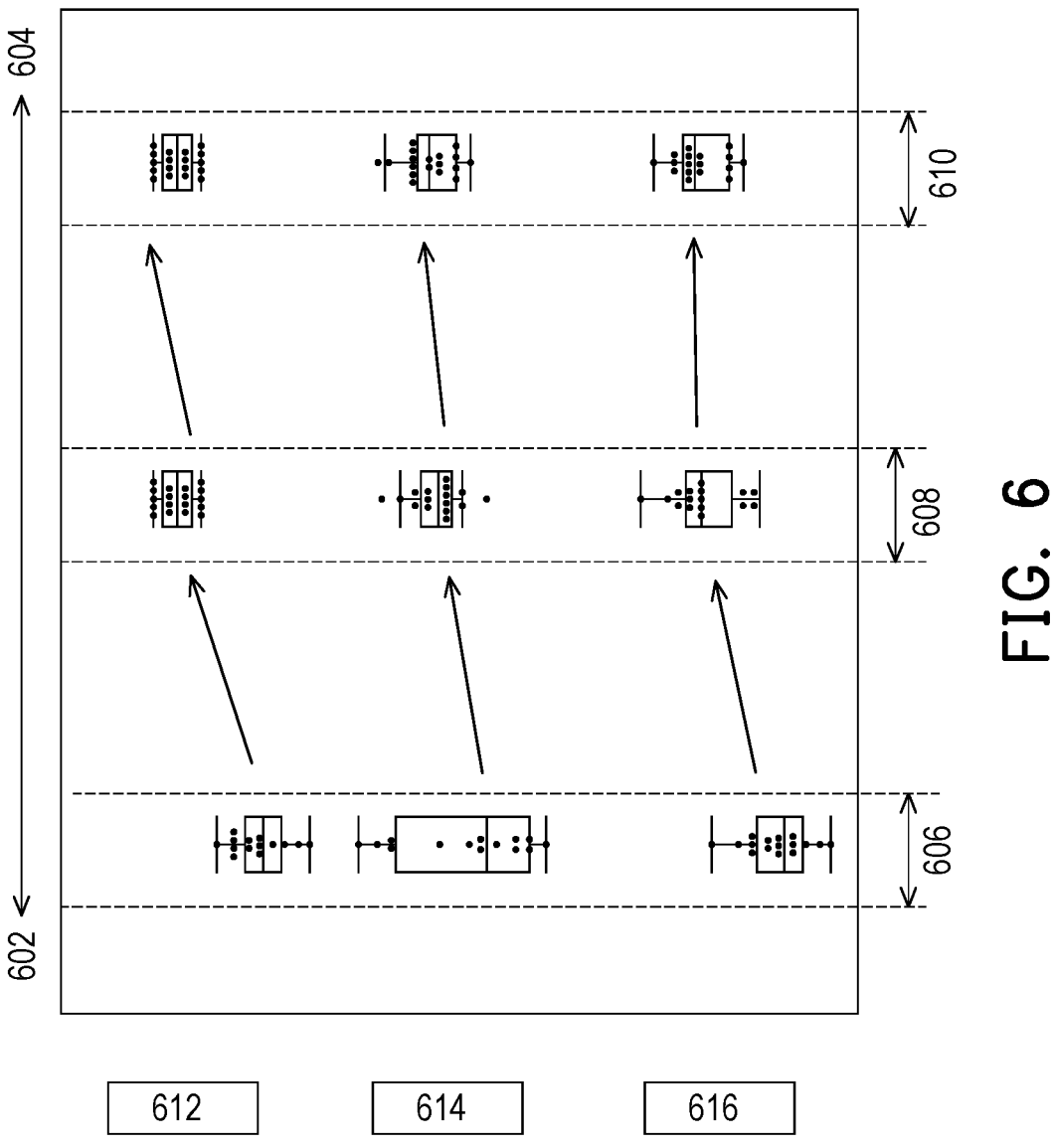
FIG. 6 is a diagram of example implementation of operational property ranges of a non-volatile memory cell structure described herein.

FIG. 6 is a diagram of example implementation 600 of operational properties of a non-volatile memory cell structure 318 described herein. Ranges for the operational properties are illustrated along a spectrum of antiferroelectric behavior of the antiferroelectric layer 316 included in the non-volatile memory cell structure 318 between more ferroelectric behavior 602 and more antiferroelectric behavior 604. In particular, the ranges operational properties are illustrated at discrete concentrations of zirconium in the antiferroelectric layer 316 of the non-volatile memory cell structure 318, including a low-end concentration 606, a middle concentration 608, and a high-end concentration 610. The operation properties include a threshold voltage (e.g., a gate threshold voltage) 612 for an erase operation, a memory window 614 in volts (V), and a drain voltage 616 for an erase operation.

As shown in FIG. 6, the threshold voltage 612 increases as the concentration of zirconium in the antiferroelectric layer 316 increases. Thus, the threshold voltage 612 needed to transition the non-volatile memory cell structure 318 to the erased state 406 decreases as the concentration of zirconium in the antiferroelectric layer 316 increases. Moreover, variation in the threshold voltage 612 decreases as the concentration of zirconium in the antiferroelectric layer 316 increases, indicating increased control and increased precision in the operation of the non-volatile memory cell structure 318.

As shown in FIG. 6, the memory window 614 increases as the concentration of zirconium in the antiferroelectric layer 316 increases. The memory window 614 is based on drain current/gate voltage curves for a program operation and an erase operation for the non-volatile memory cell structure 318. In particular, the memory window 614 is based on the difference in threshold voltages for the program operation and the erase operation (which occur along a drain current/gate voltage curves for the program operation and the erase operation) the Moreover, variation in the memory window 614 decreases as the concentration of zirconium in the antiferroelectric layer 316 increases, indicating increased control and increased precision in the operation of the non-volatile memory cell structure 318.

As shown in FIG. 6, the drain voltage 616 increases as the concentration of zirconium in the antiferroelectric layer 316 increases. Moreover, variation in the drain voltage 616 decreases as the concentration of zirconium in the antiferroelectric layer 316 increases, indicating increased control and increased precision in the operation of the non-volatile memory cell structure 318.

As indicated above, FIG. 6 is provided as an example. Other examples may differ from what is described with regard to FIG. 6.

FIGS. 7A-7L are diagrams of an example implementation 700 of forming the non-volatile memory array structure 300 described herein. In some implementations, one or more operations that are described in connection with FIGS. 7A-7L may be performed by one or more semiconductor processing tools, such as one or more of the semiconductor processing tools 102-112. In some implementations, one or more operations that are described in connection with FIGS. 7A-7L may be performed by one or more semiconductor processing tools other than the semiconductor processing tools 102-112.

Figure 7A:
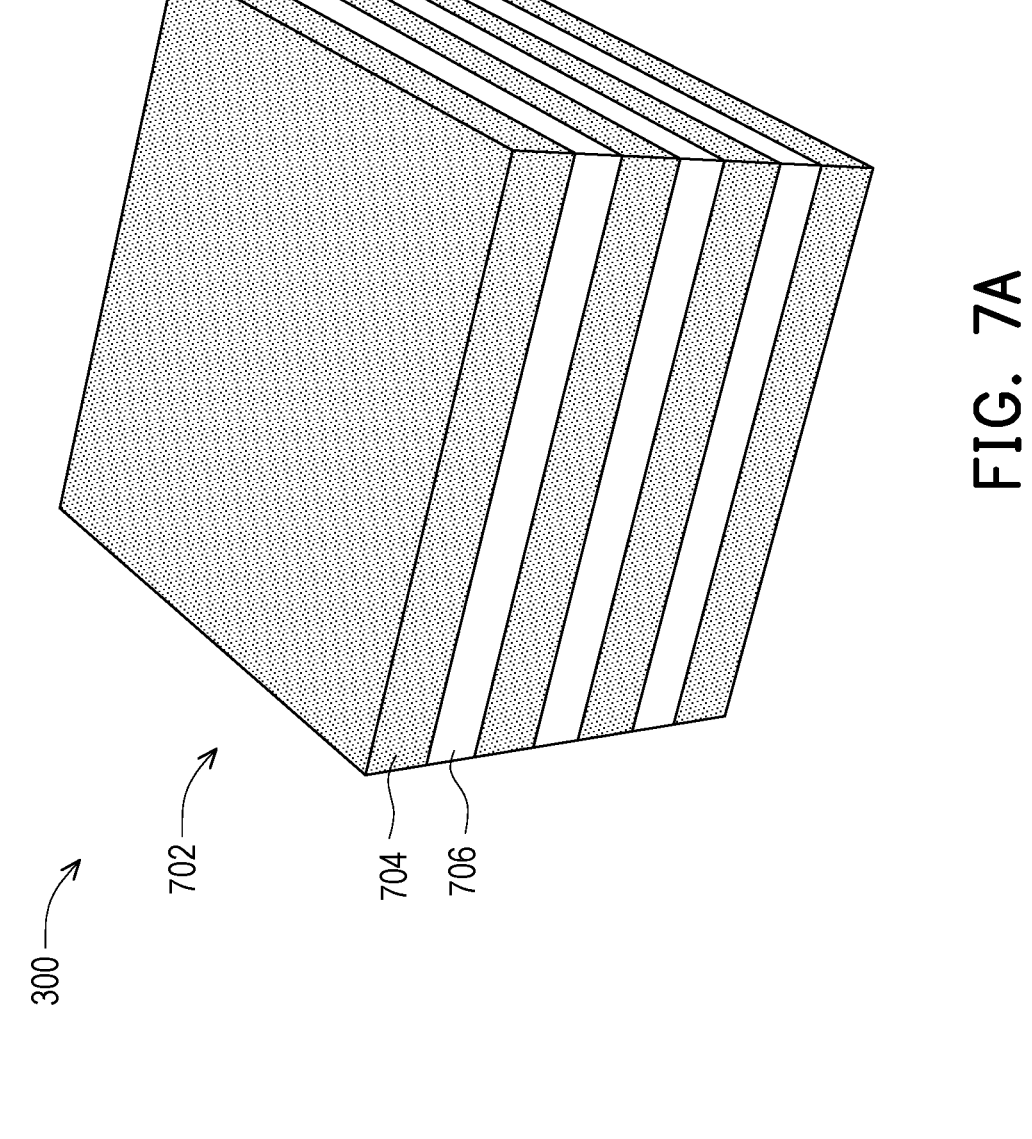

As shown in FIG. 7A, a layer stack 702 may be formed (e.g., on a substrate). The layer stack 702 may include a plurality of alternating layers of conductive layers 704 and isolation layers 706. The deposition tool 102 and/or the plating tool 112 may deposit the conductive layers 704 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the conductive layers 704 after the conductive layers 704 are deposited. The deposition tool 102 may deposit the isolation layers 706 using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the isolation layers 706.

Figure 7B:
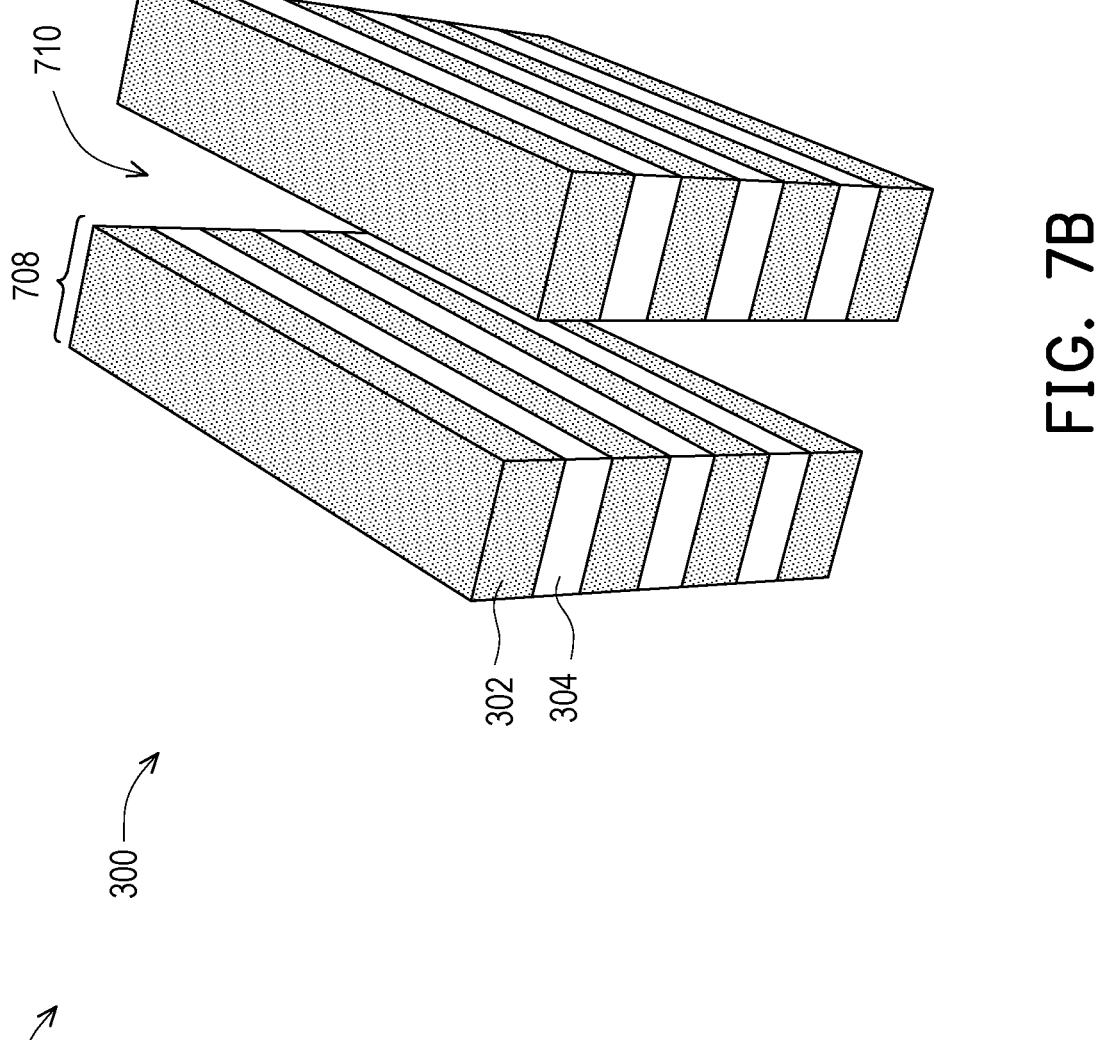

As shown in FIG. 7B, portions of the layer stack 702 may be removed to form row stacks 708 from the plurality of alternating layers of conductive layers 704 and isolation layers 706. Each row stack 708 may include a plurality of alternating layers of word line conductive structures 302 (corresponding to the conductive layers 704) and isolation layers 304 (corresponding to the isolation layers 706). The plurality of row stacks 708 may be spaced apart such that a gap 710 is included between adjacent row stacks 708.

In some implementations, a pattern in a photoresist layer is used to form the row stacks 708. In these implementations, the deposition tool 102 forms the photoresist layer on the topmost layer of the layer stack 702. The exposure tool 104 exposes the photoresist layer to a radiation source to pattern the photoresist layer. The developer tool 106 develops and removes portions of the photoresist layer to expose the pattern. The etch tool 108 etches into the layer stack 702 to form the row stacks 708. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the row stacks 708 based on a pattern.

Figure 7C:
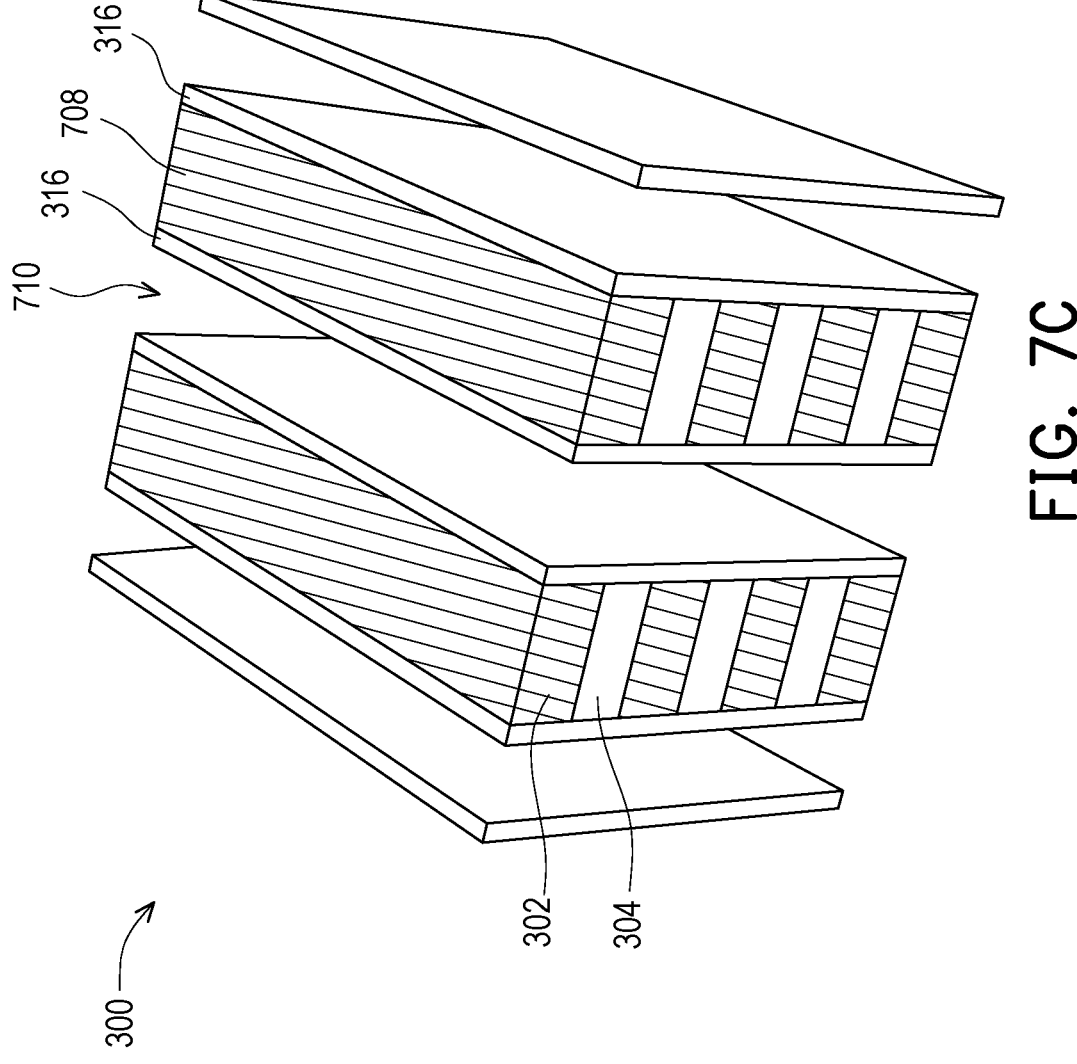

As shown in FIG. 7C, antiferroelectric layers 316 may be deposited on opposing sides of the row stacks 708. The deposition tool 102 may deposit the antiferroelectric layers 316 using an epitaxy technique, a CVD technique, a PVD technique, an ALD technique, another deposition technique described above in connection with FIG. 1, and/or a deposition technique other than as described above in connection with FIG. 1. In some implementations, the deposition tool 102 deposits the antiferroelectric layers 316 as a continuous conformal layer on the sides and tops of the row stacks 708, and on the underlying substrate between the row stacks 708. The etch tool 108 then performs an etch back operation to trim or remove portions of the conformal layer on the tops of the row stacks 708 and on the underlying substrate between the row stacks 708 to form the antiferroelectric layers 316 on the sidewalls of the row stacks 708.

Figure 7D:
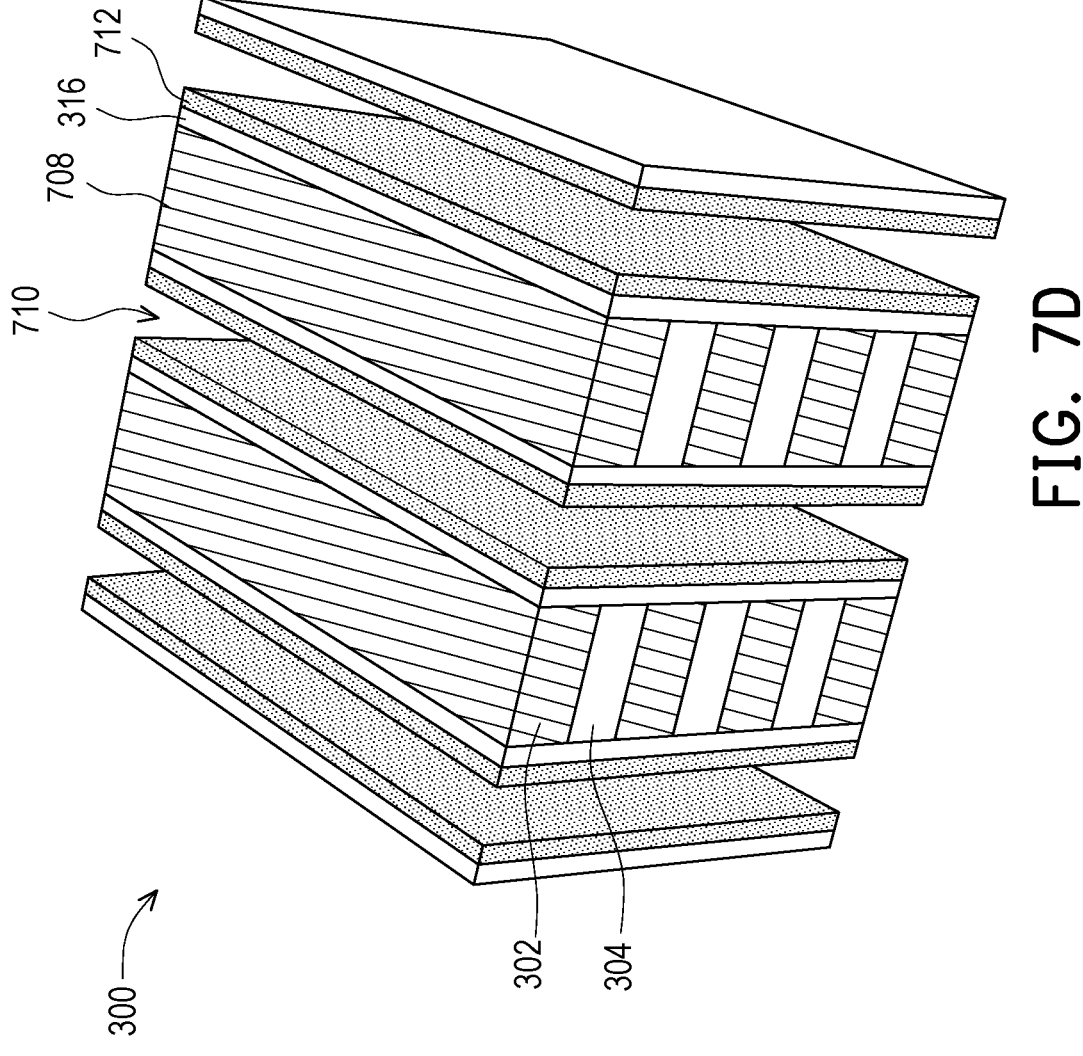

As shown in FIG. 7D, oxide semiconductor material layers 712 may be deposited on the antiferroelectric layers 316 such that the antiferroelectric layers 316 are between the sidewalls of the row stacks 708 and the oxide semiconductor material layers 712. The deposition tool 102 may deposit the oxide semiconductor material layers 712 using an epitaxy technique, a CVD technique, a PVD technique, an ALD technique, another deposition technique described above in connection with FIG. 1, and/or a deposition technique other than as described above in connection with FIG. 1. In some implementations, the deposition tool 102 deposits the oxide semiconductor material layers 712 as a continuous conformal layer on the sides and tops of the row stacks 708, and on the underlying substrate between the row stacks 708. The etch tool 108 then performs an etch back operation to trim or remove portions of the conformal layer on the tops of the row stacks 708 and on the underlying substrate between the row stacks 708 to form the oxide semiconductor material layers 712 on the sidewalls of the row stacks 708.

Figure 7E:
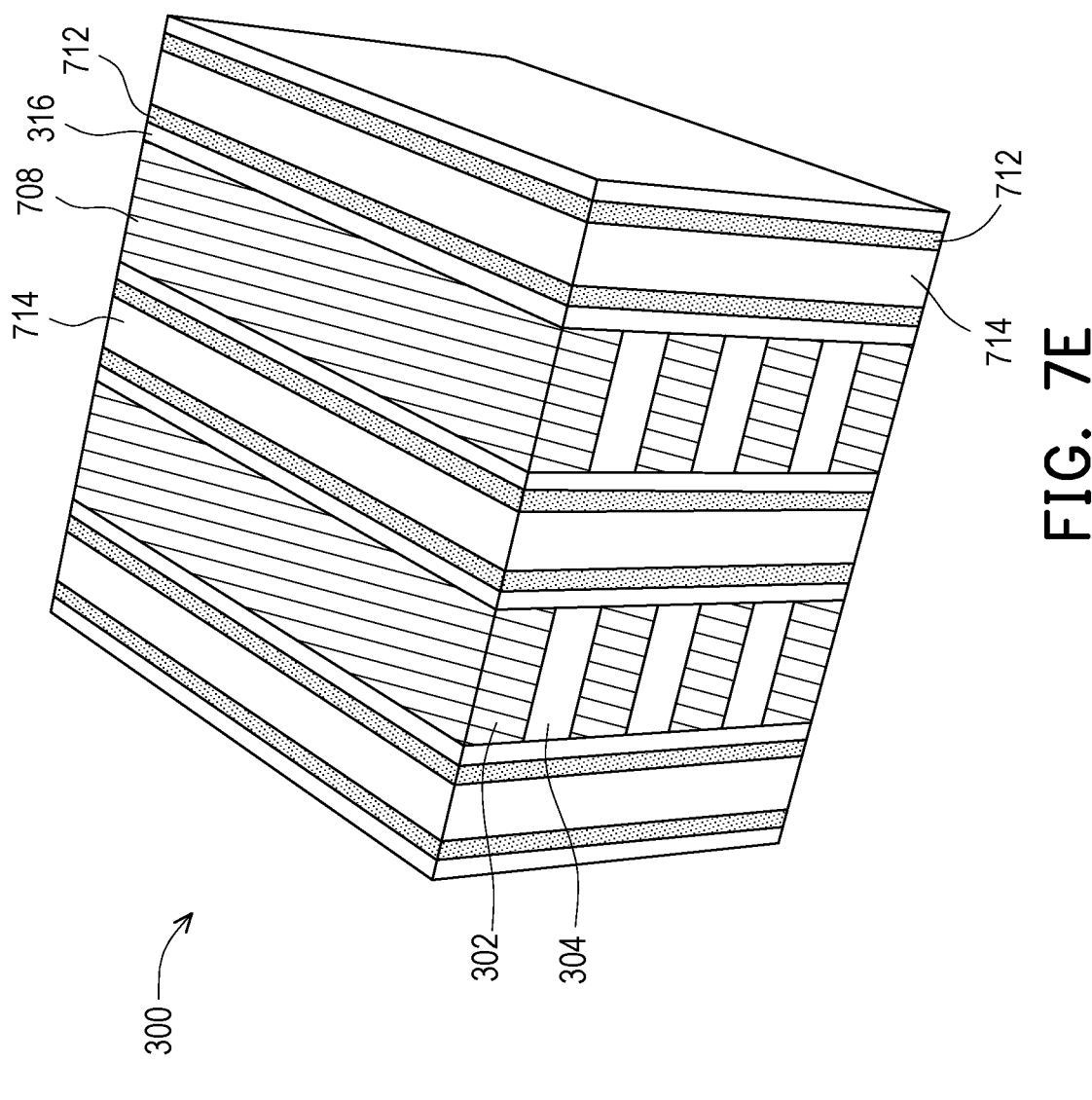

As shown in FIG. 7E, dielectric layers 714 are formed between oxide semiconductor material layers 712. The deposition tool 102 may deposit the dielectric layers 714 using an epitaxy technique, a CVD technique, a PVD technique, an ALD technique, another deposition technique described above in connection with FIG. 1, and/or a deposition technique other than as described above in connection with FIG. 1. The dielectric layers 714 are formed such that antiferroelectric layers 316 and oxide semiconductor material layers 712 are located between the dielectric layers 714 and the row stacks 708.

Figure 7F:
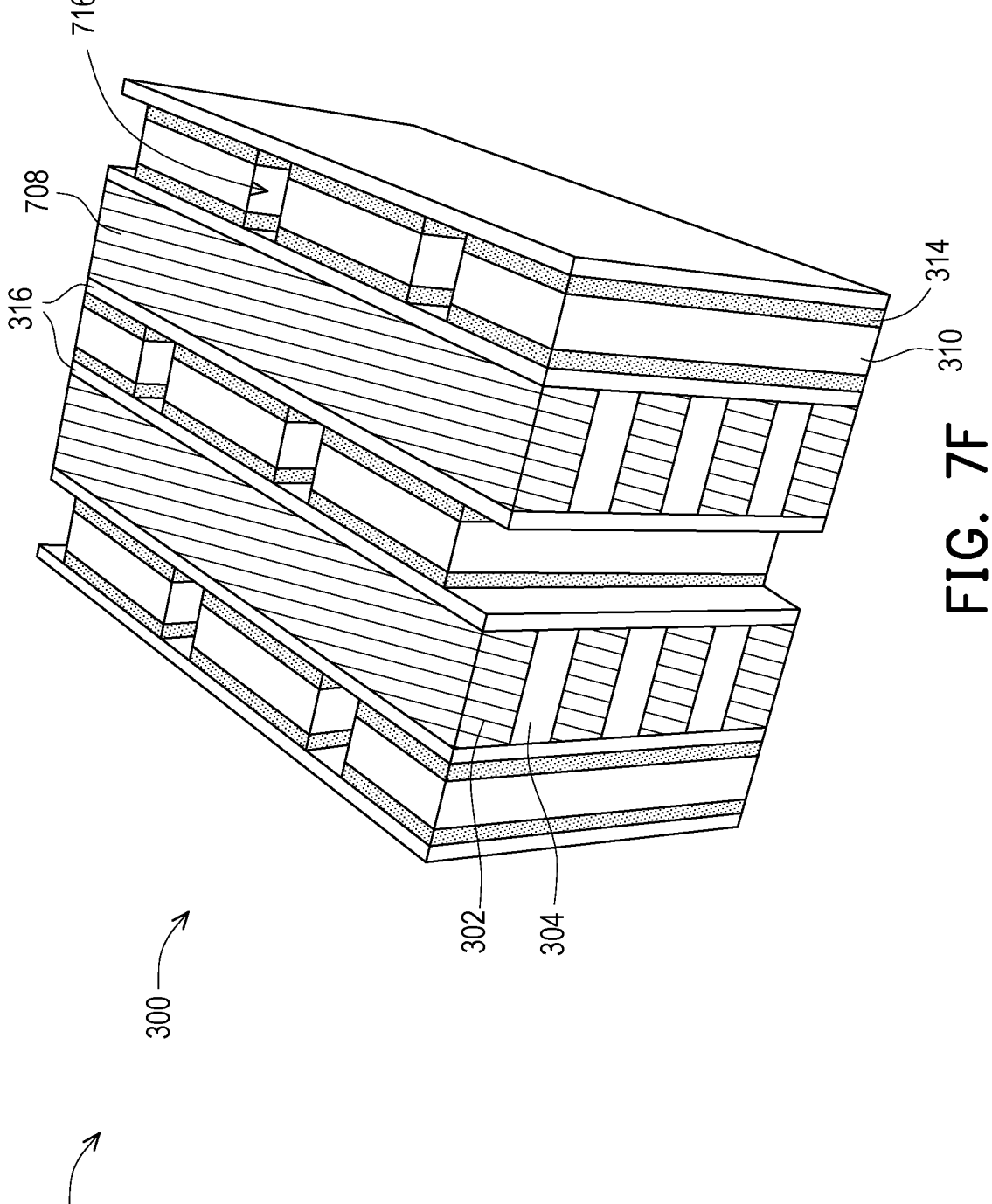

As shown in FIG. 7F, openings 716 are formed through the oxide semiconductor material layers 712 and through the dielectric layers 714 to form the isolation regions 310 and the oxide semiconductor layers 314. In some implementations, a pattern in a photoresist layer is used to form the openings 716. In these implementations, the deposition tool 102 forms the photoresist layer on the non-volatile memory array structure 300. The exposure tool 104 exposes the photoresist layer to a radiation source to pattern the photoresist layer. The developer tool 106 develops and removes portions of the photoresist layer to expose the pattern. The etch tool 108 etches the oxide semiconductor material layers 712 and the dielectric layers 714 to form the openings 716 (and thus, the isolation regions 310 and the oxide semiconductor layers 314). In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 716 based on a pattern.

Figure 7G:
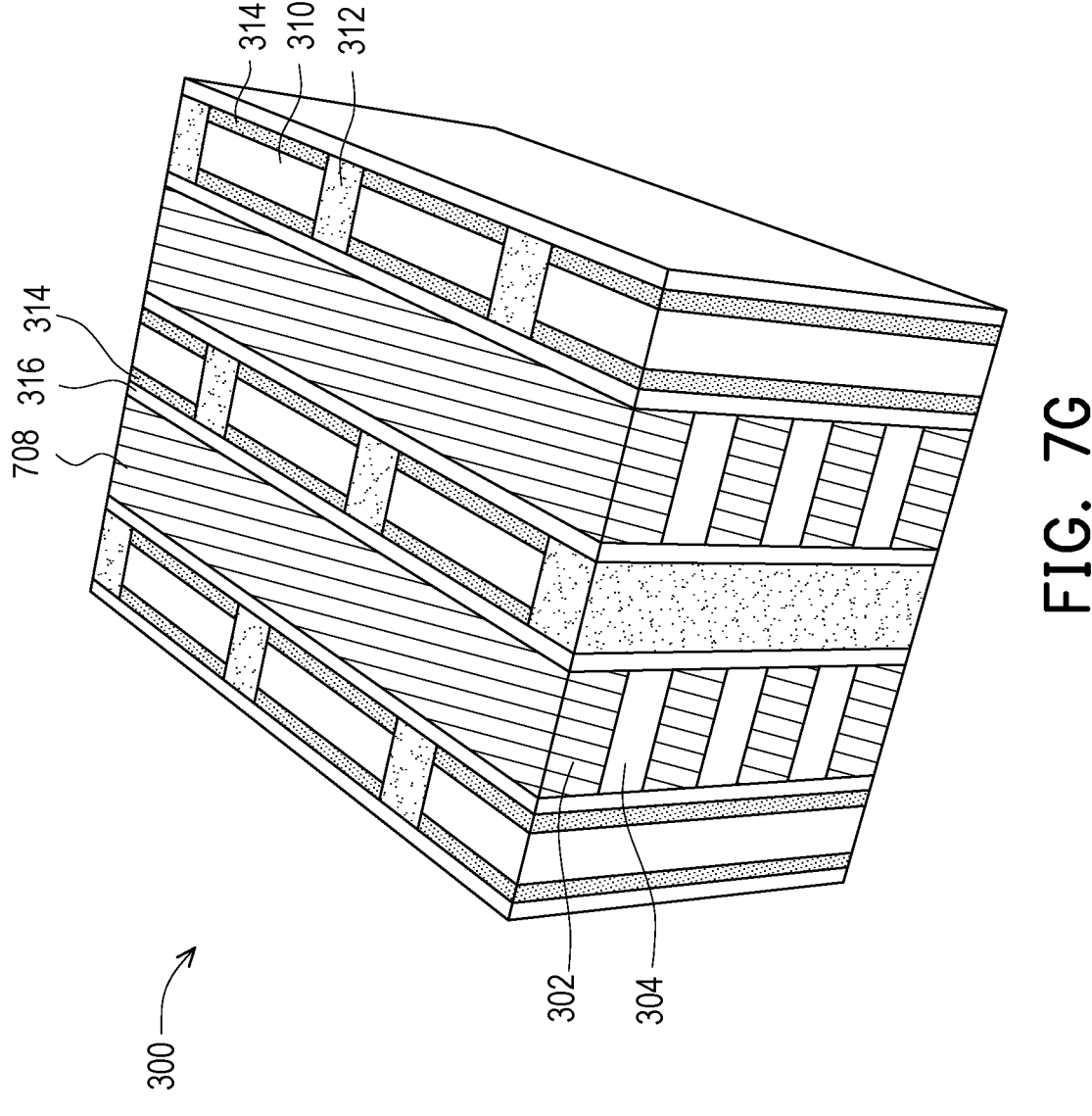

As shown in FIG. 7G, isolation pillars 312 may be formed in the openings 716. The deposition tool 102 may deposit the isolation pillars 312 using an epitaxy technique, a CVD technique, a PVD technique, an ALD technique, another deposition technique described above in connection with FIG. 1, and/or a deposition technique other than as described above in connection with FIG. 1. In some implementations, the planarization tool 110 may perform a CMP operation to planarize the isolation pillars 312.

Figure 7H:
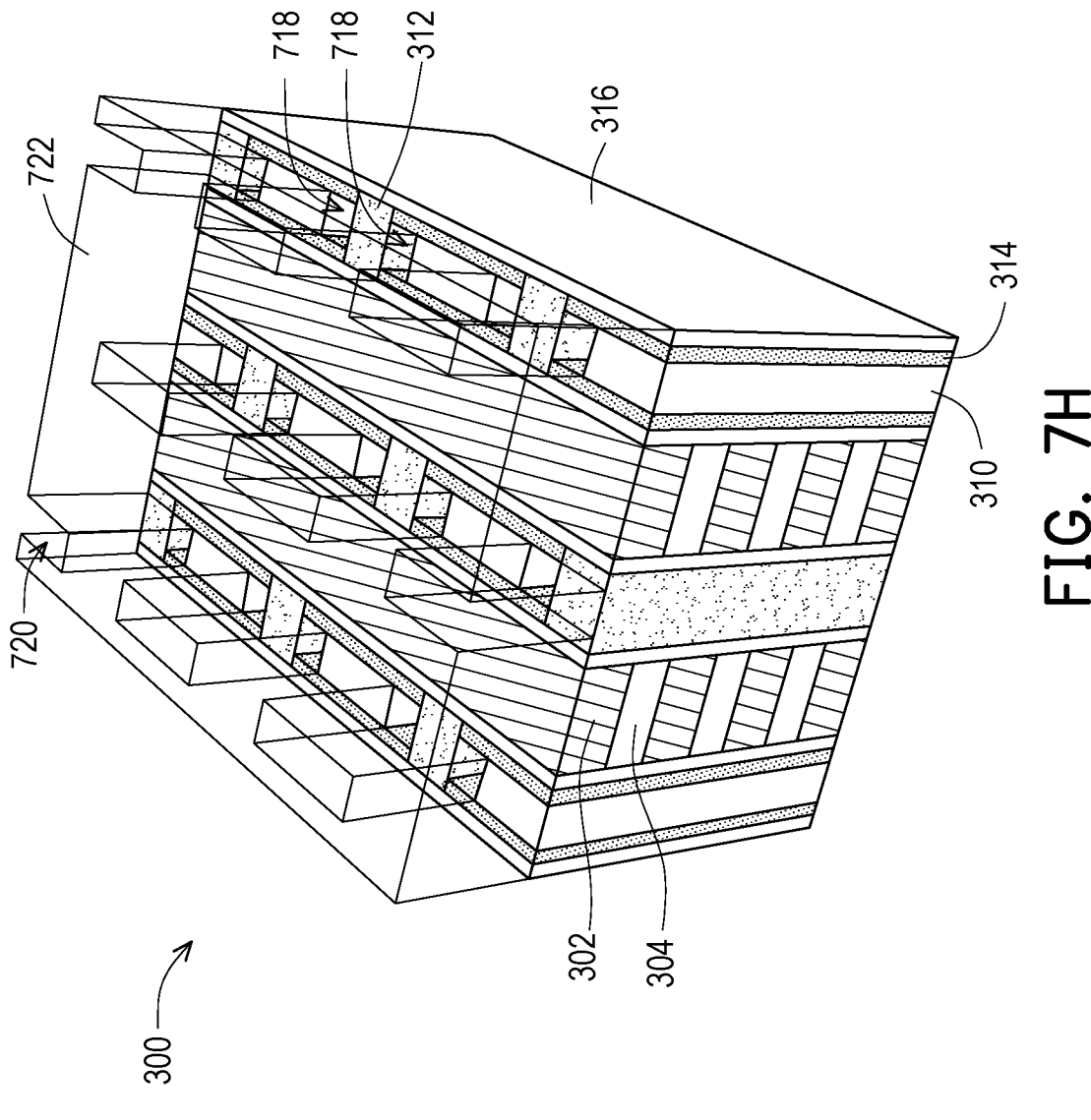
Figure 71:
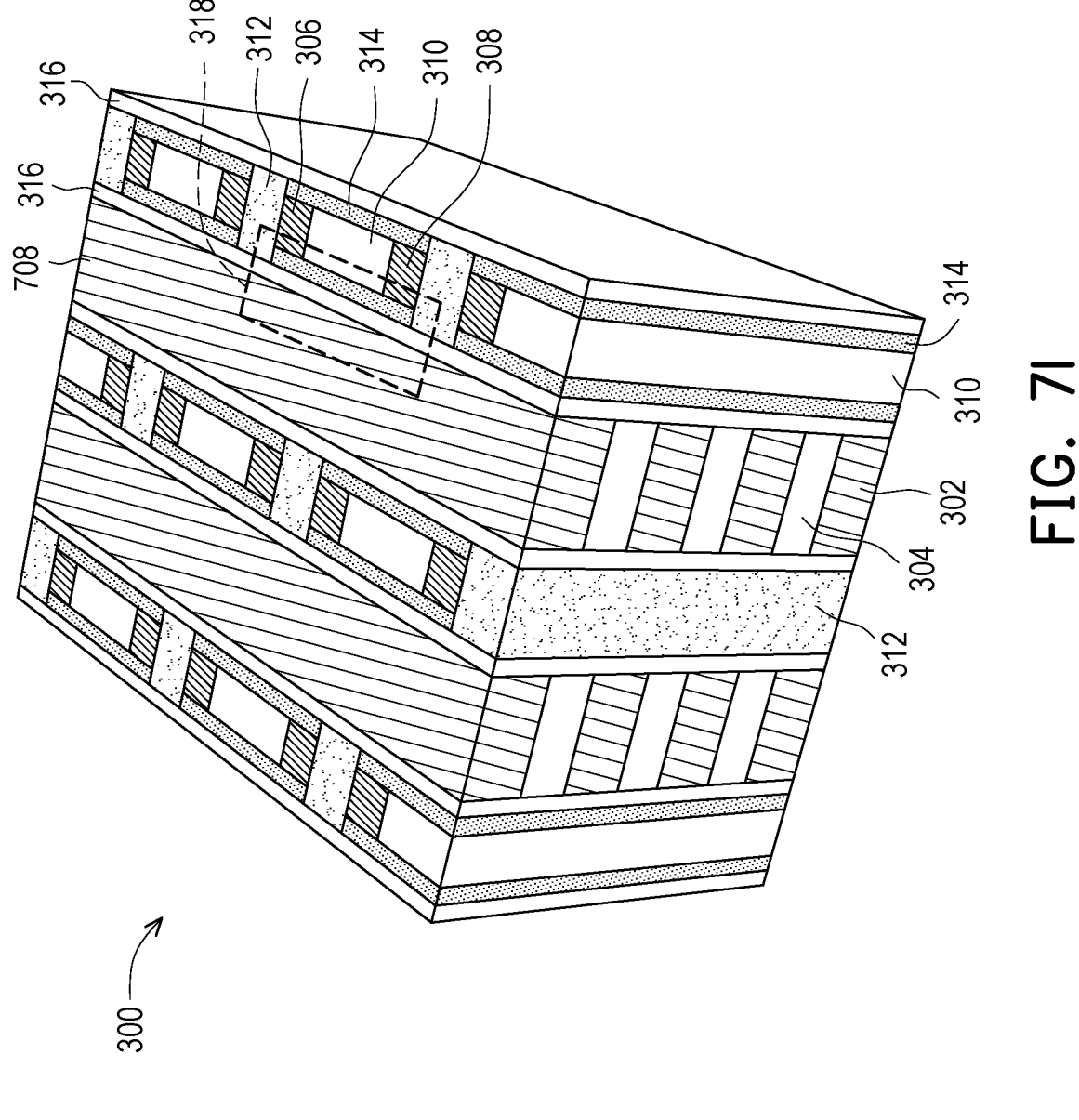

As shown in FIG. 7H, openings 718 are formed through the isolation regions 310. In some implementations, a pattern 720 in a photoresist layer 722 is used to form the openings 718. In these implementations, the deposition tool 102 forms the photoresist layer 722 on the non-volatile memory array structure 300. The exposure tool 104 exposes the photoresist layer 722 to a radiation source form the pattern 720 the photoresist layer. The developer tool 106 develops and removes portions of the photoresist layer 722 to expose the pattern 720. The etch tool 108 etches the isolation regions 310 to form the openings 718 based on the pattern 720. In some implementations, the etch operation includes a plasma etch technique, a wet chemical etch technique, and/or another type of etch technique. In some implementations, a photoresist removal tool removes the remaining portions of the photoresist layer (e.g., using a chemical stripper, plasma ashing, and/or another technique). In some implementations, a hard mask layer is used as an alternative technique for forming the openings 718 based on a pattern.

As shown in FIG. 7I, conductive pillars may be formed in the openings 718. For example, bit line conductive structures 306 may be formed in a subset of the openings 718. As another example, select line conductive structures 308 may be formed in another subset of the openings 718. The deposition tool 102 and/or the plating tool 112 may deposit the bit line conductive structures 306 and the select line conductive structures 308 using a CVD technique, a PVD technique, an ALD technique, an electroplating technique, another deposition technique described above in connection with FIG. 1, and/or a deposition technique other than as described above in connection with FIG. 1. In some implementations, the planarization tool 110 may perform a CMP operation to planarize the bit line conductive structures 306 and the select line conductive structures 308 after the bit line conductive structures 306 and the select line conductive structures 308 are deposited.

As further shown in FIG. 7I, the non-volatile memory array structure 300 may include one or more non-volatile memory cell structures 318. Each non-volatile memory cell structures 318 may include a portion of a word line conductive structure 302 in a row stack 708, a portion of a bit line conductive structure 306 adjacent to the word line conductive structure 302, a portion of a select line conductive structure 308 adjacent to the word line conductive structure 302 and separated from the portion of the bit line conductive structure 306 by a portion of an isolation region 310, a portion of an oxide semiconductor layer 314, and a portion of an antiferroelectric layer 316.

Figure 7J:
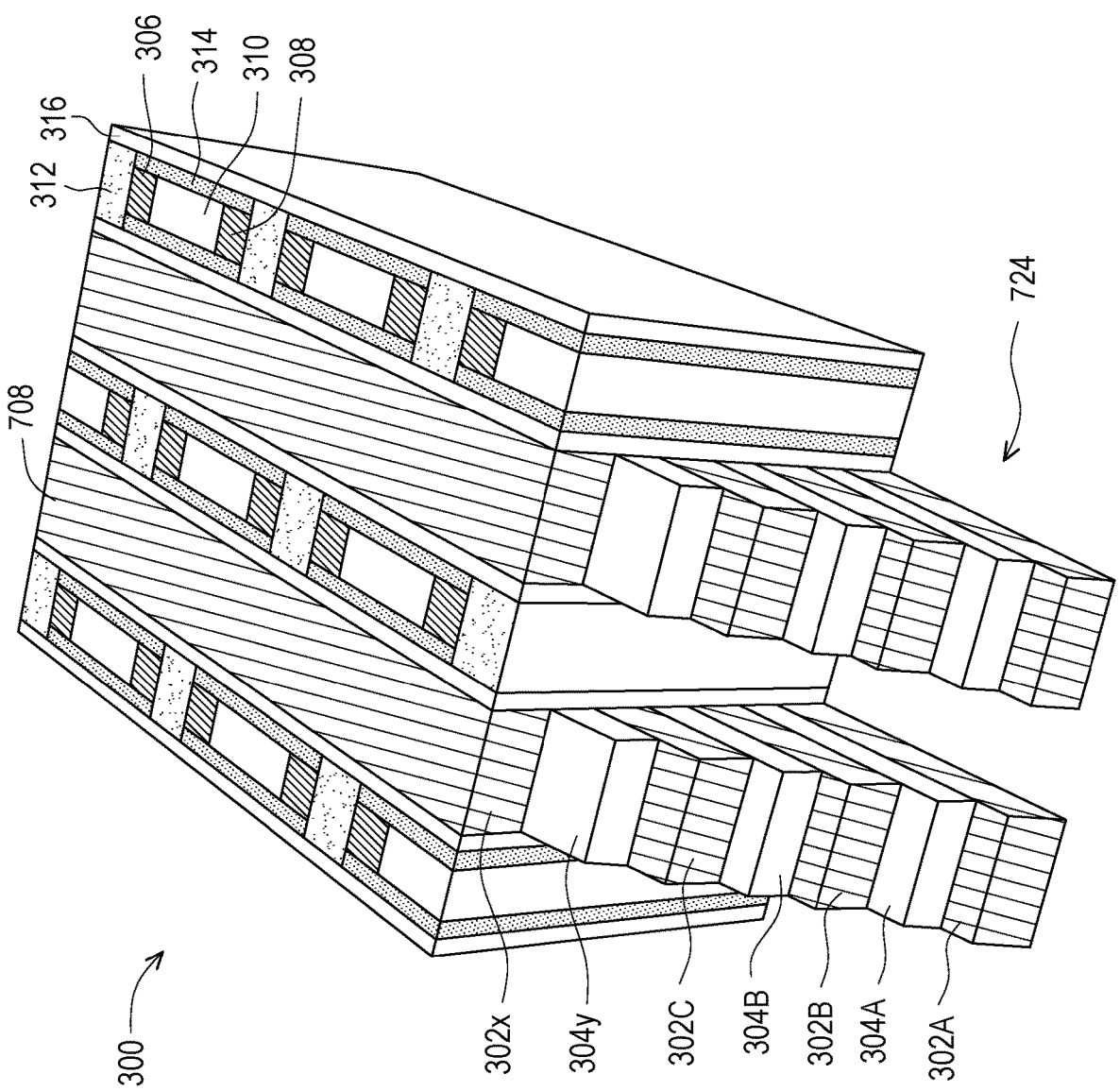

As shown in FIG. 7J, a staircase region 724 of the non-volatile memory array structure 300 may be formed. The staircase region 724 may include extension portions of the word line conductive structures 302 and extension portions of the isolation layers 304 in the row stacks 708. The deposition tool 102 and/or the plating tool 112 may deposit the extension portions of the word line conductive structures 302 using a CVD technique, a PVD technique, an ALD technique, an electroplating technique, another deposition technique described above in connection with FIG. 1, and/or a deposition technique other than as described above in connection with FIG. 1. The deposition tool 102 may deposit the extension portions of the isolation layers 304 using an epitaxy technique, a CVD technique, a PVD technique, an ALD technique, another deposition technique described above in connection with FIG. 1, and/or a deposition technique other than as described above in connection with FIG. 1.

The staircase region 724 may be formed such that the extension portions reduce in length from a bottom of the staircase region 724 to a top of the staircase region 724. For example, an extension region of a bottommost word line conductive structure 302A may be formed to the greatest length, an extension region of a topmost word line conductive structure 302x may be formed to the least length, and the lengths of the extension regions of word line conductive structures 302A through 302x may gradually decrease from the word line conductive structure 302A to the word line conductive structure 302x.

As another example, an extension region of a bottommost isolation layer 304A may be formed to the greatest length, an extension region of a topmost isolation layer 304y may be formed to the least length, and the lengths of the extension regions of isolation layer 304A through 304y may gradually decrease from the isolation layer 304A to the isolation layer 304y.

Figure 7K:
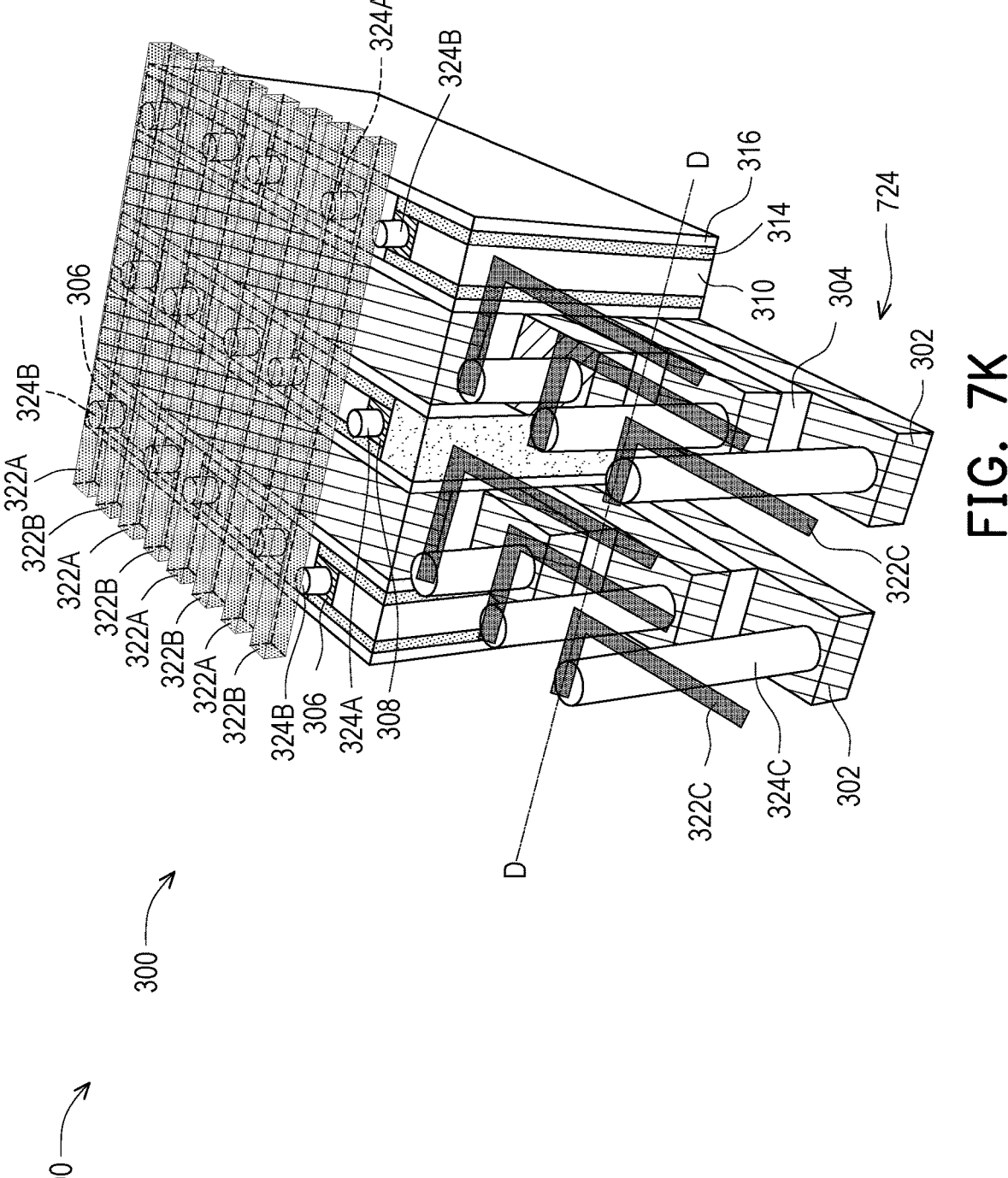

As shown in FIG. 7K, the vias 324A, 324B, and 324C may be formed in the non-volatile memory array structure 300. The conductive lines 322A, 322B, and 322C may also be formed in the non-volatile memory array structure 300. The deposition tool 102 and/or the plating tool 112 may deposit the vias 324A, 324B, and 324C using a CVD technique, a PVD technique, an ALD technique, an electroplating technique, another deposition technique described above in connection with FIG. 1, and/or a deposition technique other than as described above in connection with FIG. 1. The deposition tool 102 and/or the plating tool 112 may deposit the conductive lines 322A, 322B, and 322C using a CVD technique, a PVD technique, an ALD technique, an electroplating technique, another deposition technique described above in connection with FIG. 1, and/or a deposition technique other than as described above in connection with FIG. 1.

Figure 7L:
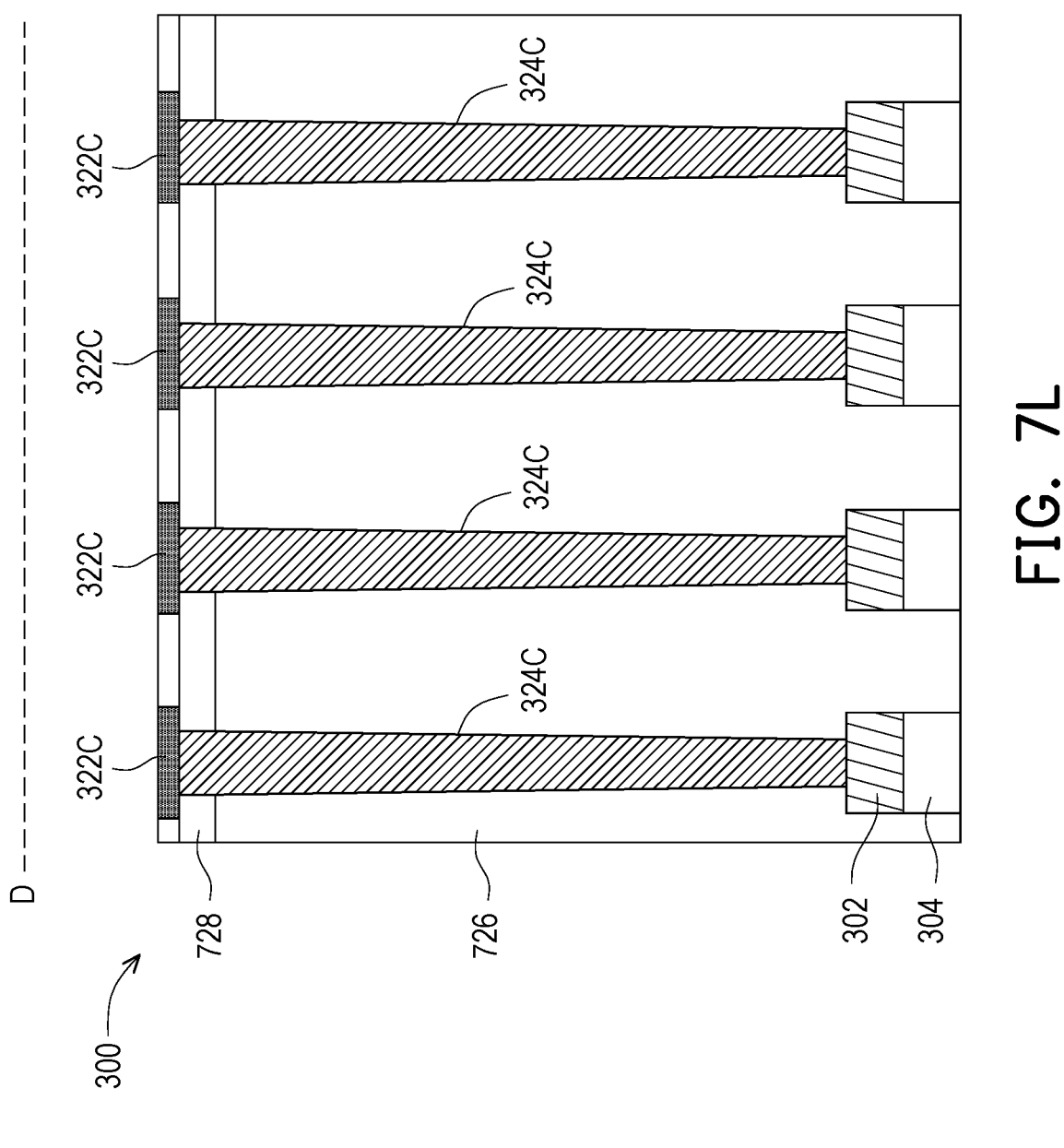

FIG. 7L illustrates a cross-sectional view of the non-volatile memory array structure 300 along the line D-D in FIG. 7K. As shown in FIG. 7L, the vias 324C may extend between the word line conductive structures 302 and the conductive lines 322C. The vias 324C may extend through a dielectric layer 726 and an etch stop layer 728.

As indicated above, FIGS. 7A-7L is provided as an example. Other examples may differ from what is described with regard to FIGS. 7A-7L.

Figure 8:
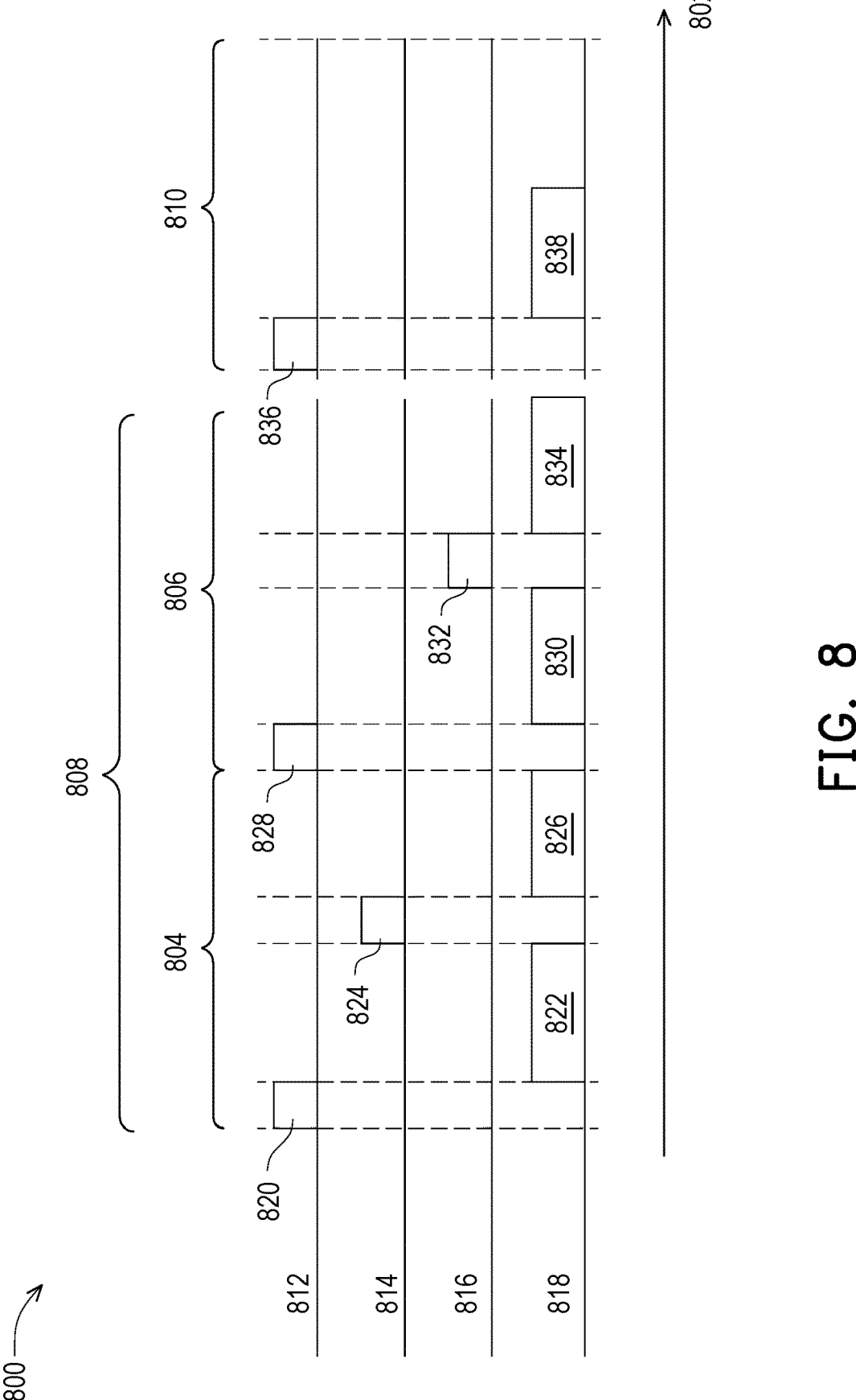
FIG. 8 is a diagram of an example implementation of a deposition process for forming an antiferroelectric layer described herein.

FIG. 8 is a diagram of an example implementation 800 of a deposition process for forming an antiferroelectric layer 316 described herein. In some implementations, one or more operations that are described in connection with FIG. 8 may be performed by one or more semiconductor processing tools, such as one or more of the semiconductor processing tools 102-112. In some implementations, one or more operations that are described in connection with FIG. 8 may be performed by one or more semiconductor processing tools other than the semiconductor processing tools 102-112.

FIG. 8 illustrates a plurality of processing operations of the deposition process as a function of time 802. As shown in FIG. 8, a plurality of sequential deposition operations may be performed in the deposition process, including a first ALD operation 804 followed by a second ALD operation 806. The first ALD operation 804 and the second ALD operation 806 may be performed for a plurality of ALD cycles 808 (e.g., until a sufficient or desired thickness of the antiferroelectric layer 316 is achieved). After the plurality of ALD cycles 808 are performed, an anneal operation 810 may be performed.

The first ALD operation 804, the second ALD operation 806, and the anneal operation 810 may involve the use of various chemicals, carrier gasses, precursors, and/or reactant gasses, among other examples. For example, an oxygen precursor 812 may include water ($H_2O$) and/or another type of oxygen precursor. As another example, a hafnium precursor 814 may include hafnium tetrachloride ($HfCl_4$) and/or another type of hafnium precursor. As another example, a zirconium precursor 816 may include zirconium tetrachloride ($ZrCl_4$) and/or another type of zirconium precursor. As another example, a nitrogen gas (N 2) 818 may be used as a carrier gas.

The first ALD operation 804 may include introducing the oxygen precursor 812 into a supply line of the deposition tool 102 for a time duration 820. The carrier gas 818 is then used for a time duration 822 to provide a flow of the oxygen precursor 812 from the supply line to a processing chamber of the deposition tool 102. Next, the hafnium precursor 814 is introduced into a supply line of the deposition tool 102 for a time duration 824, and the carrier gas 818 is then used for a time duration 826 to provide a flow of the hafnium precursor 814 from the supply line to a processing chamber of the deposition tool 102. The oxygen precursor 812 and the hafnium precursor 814 in the processing chamber react to form a layer of hafnium oxide ($HfO_x$ such as $HfO_2$). Byproducts from the reaction are removed from the processing chamber.

The second ALD operation 806 may include introducing the oxygen precursor 812 into a supply line of the deposition tool 102 for a time duration 828. The carrier gas 818 is then used for a time duration 830 to provide a flow of the oxygen precursor 812 from the supply line to a processing chamber of the deposition tool 102. Next, the zirconium precursor 816 is introduced into a supply line of the deposition tool 102 for a time duration 832, and the carrier gas 818 is then used for a time duration 834 to provide a flow of the zirconium precursor 816 from the supply line to a processing chamber of the deposition tool 102. The oxygen precursor 812 and the zirconium precursor 816 in the processing chamber react to form a layer of zirconium oxide ($ZrO_x$ such as $ZrO_2$) Byproducts from the reaction are removed from the processing chamber.

The first ALD operation 804 and the second ALD operation 806 may be performed for a plurality of ALD cycles 808 to form an alternating arrangement of hafnium oxide layers and zirconium oxide layers. The anneal operation 810 may include introducing the oxygen precursor 812 into a supply line of the deposition tool 102 for a time duration 836. The carrier gas 818 is then used for a time duration 838 to provide a flow of the oxygen precursor 812 from the supply line to a processing chamber of the deposition tool 102. A plasma is ignited in the processing chamber, in which oxygen ions from the oxygen precursor 812 are used to anneal the alternating arrangement of hafnium oxide layers and zirconium oxide layers, which results in the formation of a single-layer structure for the antiferroelectric layer 316.

As indicated above, FIG. 8 is provided as an example. Other examples may differ from what is described with regard to FIG. 8.

Figure 9A:
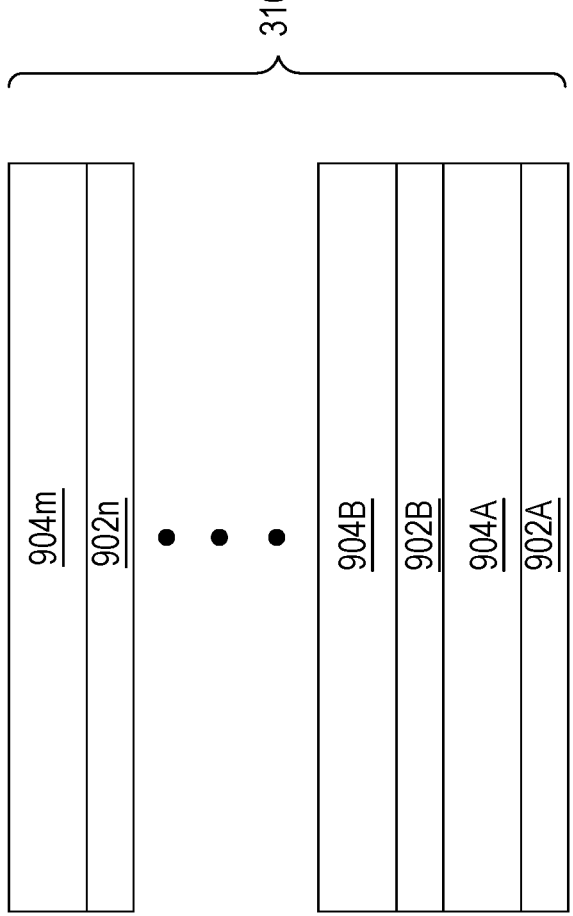
FIGS. 9A and 9B are diagrams of an example implementation of forming an antiferroelectric layer described herein described herein.
Figure 9B:
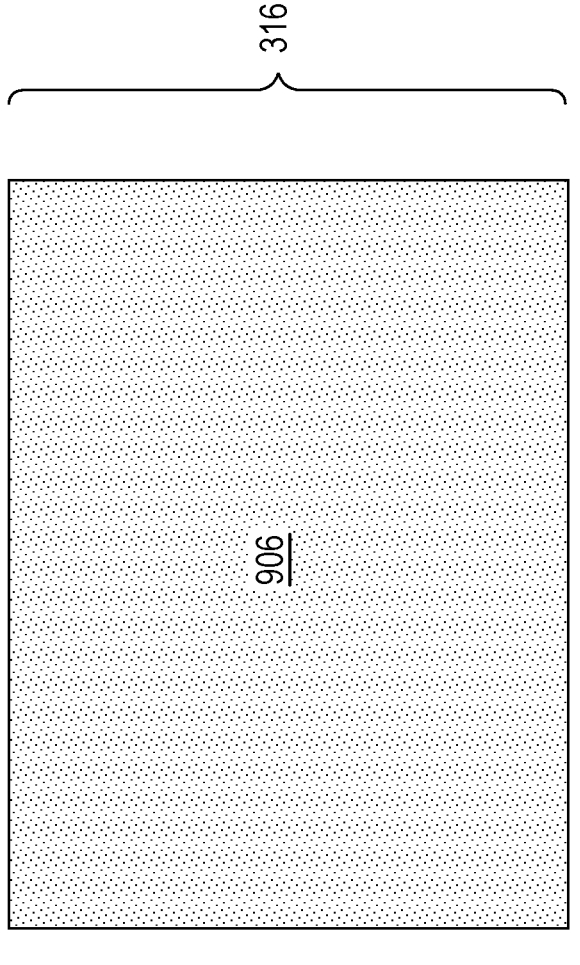

FIGS. 9A and 9B are diagrams of an example implementation 900 of forming an antiferroelectric layer 316 described herein described herein. As shown in FIG. 9A, forming the antiferroelectric layer 316 may include forming a nanosheet stack. The nanosheet stack may be formed by performing the deposition process described above in connection with FIG. 8, for example.

Forming the nanosheet stack may include forming (e.g., in the ALD operation 804) a plurality of nanosheets 902A-902n, and forming (e.g., in the ALD operation 806) a plurality nanosheets 904A-904m alternating with the first plurality of nanosheets 902A-902n. For example, the deposition tool 102 may perform a first ALD operation 804 in a first ALD cycle 808 to form the nanosheet 902A. The deposition tool 102 may perform a second ALD operation 806 in the first ALD cycle 808 to form the nanosheet 904A on the nanosheet 902A. The deposition tool 102 may perform a first ALD operation 804 in a second ALD cycle 808 to form the nanosheet 902B on the nanosheet 904A. The deposition tool 102 may perform a second ALD operation 806 in the second ALD cycle 808 to form the nanosheet 904B on the nanosheet 902B. The deposition tool 102 may continue to perform additional ALD cycles 808 to form the nanosheet stack.

The plurality of nanosheets 902A-902n may include hafnium oxide ($HfO_x$) nanosheets, and the plurality of nanosheets 904A-904m may include zirconium oxide ($ZrO_x$) nanosheets. To achieve a greater concentration of zirconium oxide relative to hafnium oxide in the antiferroelectric layer 316, the time duration of the ALD operations 806 may be greater relative to a time duration of the ALD operations 804. As a result, the thickness of the plurality of nanosheets 904A-904m may be greater relative to the thickness of the plurality of nanosheets 902A-902n. The greater concentration of zirconium oxide relative to hafnium oxide in the antiferroelectric layer 316 enables antiferroelectric properties for the antiferroelectric layer 316 to be achieved. Accordingly, the antiferroelectric layer 316 is a single-layer structure 906 that includes a plurality of materials, such as hafnium zirconium oxide (HfZrO), among other examples.

As shown in FIG. 9B, the nanosheet stack of the plurality of nanosheets 902A-902n and the plurality of nanosheets 904A-904m may be transformed into a single-layer structure 906. The deposition tool 102 may perform anneal operation 810 to cause the plurality of nanosheets 902A-902n and the plurality of nanosheets 904A-904m to diffuse into the single-layer structure 906 in the antiferroelectric layers 316.

As indicated above, FIGS. 9A and 9B are provided as example. Other examples may differ from what is described with regard to FIGS. 9A and 9B. For example, the antiferroelectric layer 316 may be deposited (e.g., using a CVD technique) as a single-layer structure as opposed to forming the nanosheet stack and annealing the nanosheet stack to form the single-layer structure, as described above in connection with FIG. 8.

Figure 10:
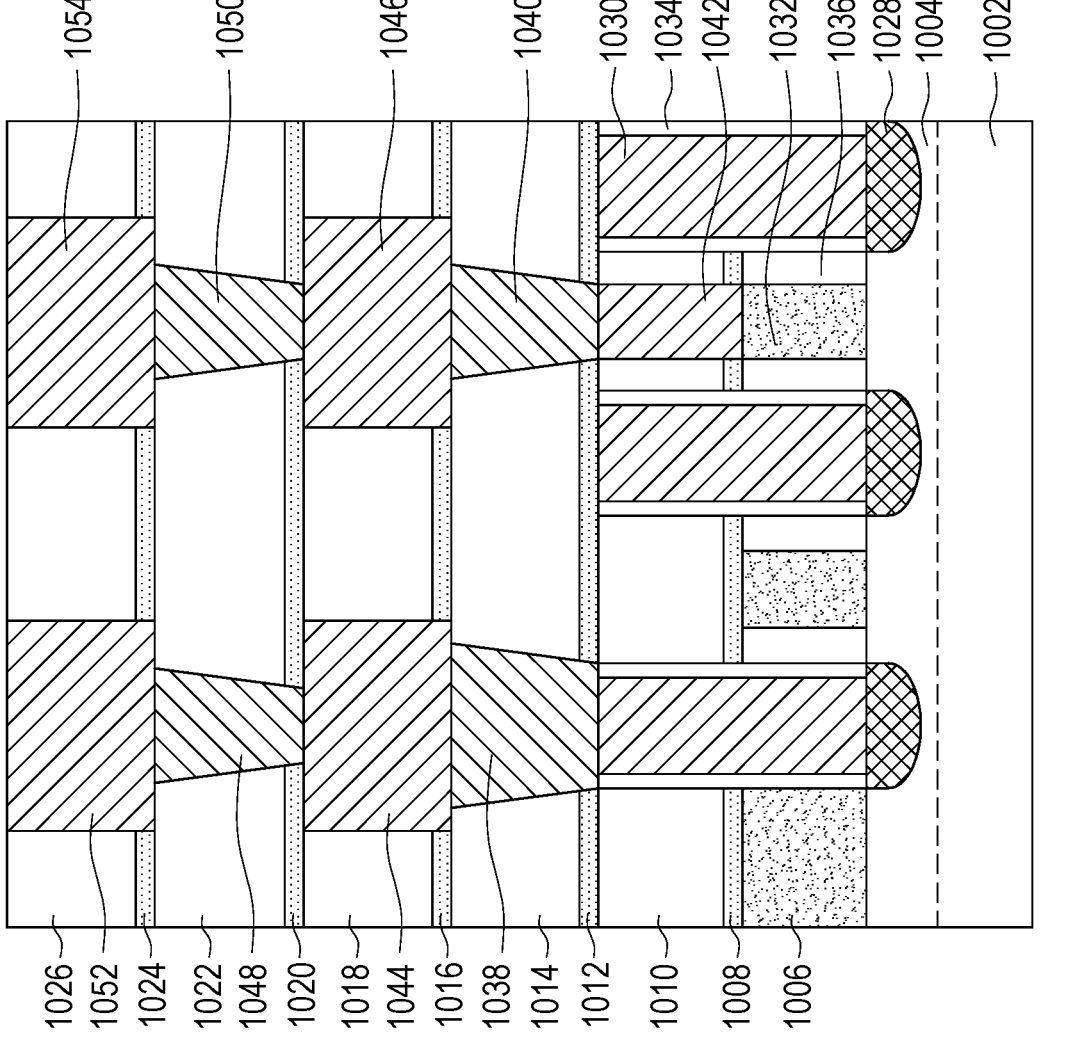
FIG. 10 is a diagram of a portion of an example device described herein.

FIG. 10 is a diagram of a portion of an example device 1000 described herein. Device 1000 includes an example of a memory device (e.g., a static random access memory (SRAM), a dynamic random access memory (DRAM)), a logic device, a processor, an input/output device, or another type of semiconductor device that includes one or more transistors.

The device 1000 includes a substrate 1002 and one or more fin structures 1004 formed above the substrate 1002. The device 1000 includes one or more stacked layers, including a dielectric layer 1006, a dielectric layer 1008, an etch stop layer (ESL) 1008, a dielectric layer 1010, an ESL 1012, a dielectric layer 1014, an ESL 1016, a dielectric layer 1018, an ESL 1020, a dielectric layer 1022, an ESL 1024, and a dielectric layer 1026, among other examples. The dielectric layers 1006, 1010, 1014, 1018, 1022, and 1026 are included to electrically isolate various structures of the device 1000. The dielectric layers 1006, 1010, 1014, 1018, 1022, and 1026 include a silicon nitride ($SiN_x$), an oxide (e.g., a silicon oxide ($SiO_x$) and/or another oxide material), and/or another type of dielectric material. The ESLs 1008, 1012, 1016, 1020, 1024 includes a layer of material that is configured to permit various portions of the device 1000 (or the layers included therein) to be selectively etched or protected from etching to form one or more of the structures included in the device 1000.

As further shown in FIG. 10, the device 1000 includes a plurality of epitaxial (epi) regions 1028 that are grown and/or otherwise formed on and/or around portions of the fin structure 1004. The epitaxial regions 1028 are formed by epitaxial growth. In some implementations, the epitaxial regions 1028 are formed in recessed portions in the fin structure 1004. The recessed portions may be formed by strained source drain (SSD) etching of the fin structure 1004 and/or another type etching operation. The epitaxial regions 1028 function as source or drain regions of the transistors included in the device 1000.

The epitaxial regions 1028 are electrically connected to metal source or drain contacts 1030 of the transistors included in the device 1000. The metal source or drain contacts (MDs or CAs) 1030 include cobalt (Co), ruthenium (Ru), and/or another conductive or metal material. The transistors further include gates 1032 (MGs), which are formed of a polysilicon material, a metal (e.g., tungsten (W) or another metal), and/or another type of conductive material. The metal source or drain contacts 1030 and the gates 1032 are electrically isolated by one or more sidewall spacers, including spacers 1034 in each side of the metal source or drain contacts 1030 and spacers 1036 on each side of the gate 1032. The spacers 1034 and 1036 include a silicon oxide ($SiO_x$), a silicon nitride ($Si_xN_y$), a silicon oxy carbide (SiOC), a silicon oxycarbonitride (SiOCN), and/or another suitable material. In some implementations, the spacers 1034 are omitted from the sidewalls of the source or drain contacts 1030.

As further shown in FIG. 10, the metal source or drain contacts 1030 and the gates 1032 are electrically connected to one or more types of interconnects. The interconnects electrically connect the transistors of the device 1000 and/or electrically connect the transistors to other areas and/or components of the device 1000. In some implementations, the interconnects electrically connect the transistors to a back end of line (BEOL) region of the device 1000.

The metal source or drain contacts 1030 are electrically connected to source or drain interconnects 1038 (e.g., source/drain vias or VDs). One or more of the gates 1032 are electrically connected to gate interconnects 1040 (e.g., gate vias or VGs). The interconnects 1038 and 1040 include a conductive material such as tungsten, cobalt, ruthenium, copper, and/or another type of conductive material. In some implementations, the gates 1032 are electrically connected to the gate interconnects 1040 by gate contacts 1042 (CB or MP) to reduce contact resistance between the gates 1032 and the gate interconnects 1040. The gate contacts 1042 include tungsten (W), cobalt (Co), ruthenium (Ru), titanium (Ti), aluminum (Al), copper (Cu) or gold (Au), among other examples of conductive materials.

As further shown in FIG. 10, the interconnects 1038 and 1040 are electrically connected to a plurality of BEOL layers, each including one or more metallization layers and/or vias. As an example, the interconnects 1038 and 1040 may be electrically connected to an M0 metallization layer that includes conductive structures 1044 and 1046. The M0 metallization layer is electrically connected to a V0 via layer that includes vias 1048 and 1050. The V0 via layer is electrically connected to an M1 metallization that includes conductive structures 1052 and 1054. In some implementations, the BEOL layers of the device 1000 includes additional metallization layers and/or vias that connect the device 1000 to a package.

The non-volatile memory array structure 300 and/or one or more non-volatile memory cell structures 318 included therein may be included in one or more layers and/or in one or more regions of the device 1000. For example, the non-volatile memory array structure 300 and/or one or more non-volatile memory cell structures 318 may be included in one or more of the BEOL layers of the device 1000. In these examples, the non-volatile memory array structure 300 and/or one or more non-volatile memory cell structures 318 may be included in one or more of the dielectric layers 1010, 1014, 1018, 1022, 1026, and/or another dielectric layer in the BEOL region of the device 1000. Moreover, the non-volatile memory array structure 300 and/or one or more non-volatile memory cell structures 318 may be electrically connected with one or more of the conductive structures 1044, 1046, 1052, 1054, and/or another conductive structure in the BEOL region of the device 1000; and/or may be electrically connected with one or more of the vias 1048, 1050, and/or another via in the BEOL region of the device 1000.

As indicated above, FIG. 10 is provided as an example. Other examples may differ from what is described with regard to FIG. 10.

Figure 11:
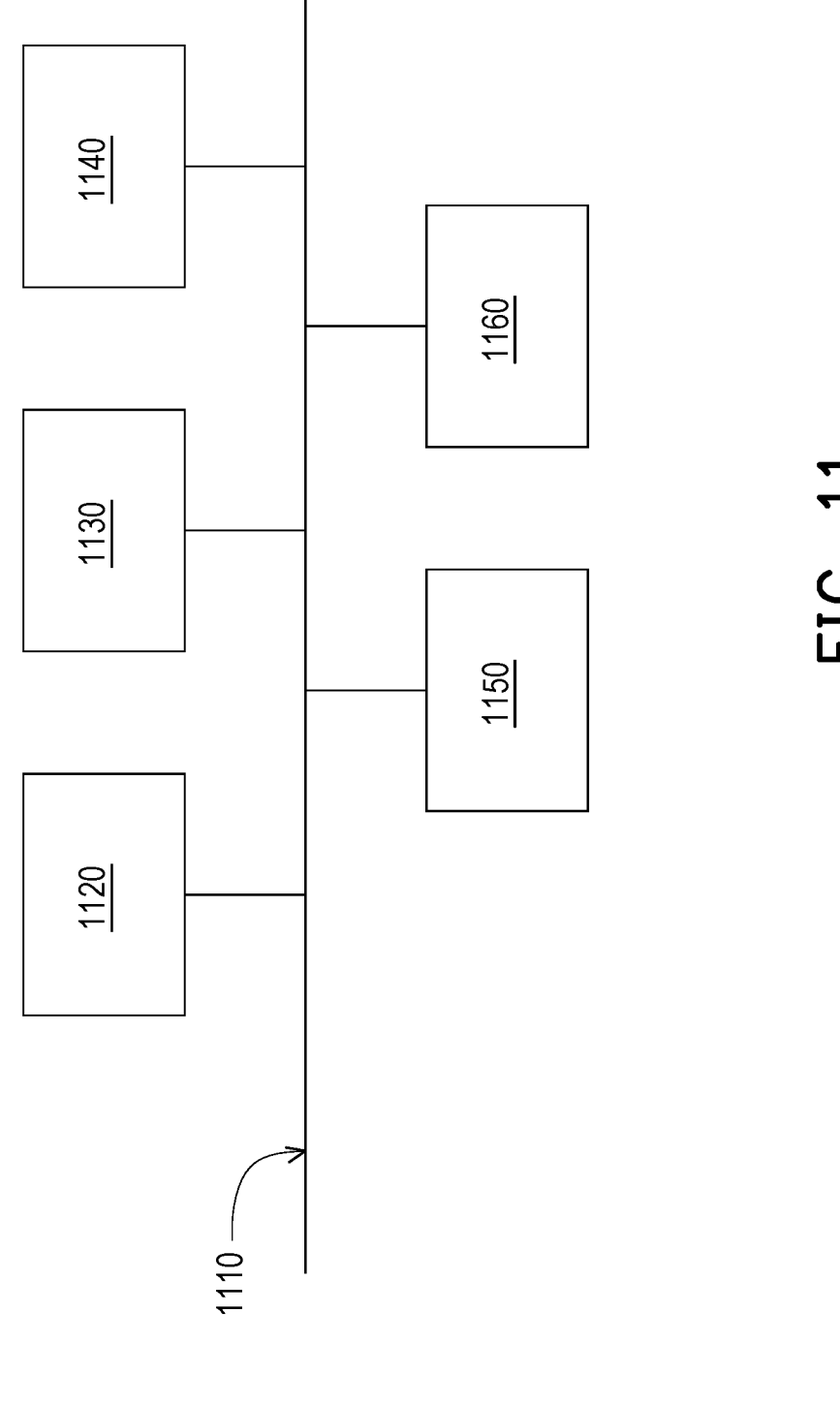
FIG. 11 is a diagram of example components of a device described herein.

FIG. 11 is a diagram of example components of a device 1100 described herein. In some implementations, one or more of the semiconductor processing tools 102-112 and/or the wafer/die transport tool 114 may include one or more devices 1100 and/or one or more components of device 1100. As shown in FIG. 11, device 1100 may include a bus

1110, a processor 1120, a memory 1130, an input component 1140, an output component 1150, and a communication component 1160.

Bus 1110 may include one or more components that enable wired and/or wireless communication among the components of device 1100. Bus 1110 may couple together two or more components of FIG. 11, such as via operative coupling, communicative coupling, electronic coupling, and/or electric coupling. Processor 1120 may include a central processing unit, a graphics processing unit, a microprocessor, a controller, a microcontroller, a digital signal processor, a field-programmable gate array, an application-specific integrated circuit, and/or another type of processing component. Processor 1120 is implemented in hardware, firmware, or a combination of hardware and software. In some implementations, processor 1120 may include one or more processors capable of being programmed to perform one or more operations or processes described elsewhere herein.

Memory 1130 may include volatile and/or nonvolatile memory. For example, memory 1130 may include random access memory (RAM), read only memory (ROM), a hard disk drive, and/or another type of memory (e.g., a flash memory, a magnetic memory, and/or an optical memory). Memory 1130 may include internal memory (e.g., RAM, ROM, or a hard disk drive) and/or removable memory (e.g., removable via a universal serial bus connection). Memory 1130 may be a non-transitory computer-readable medium. Memory 1130 stores information, instructions, and/or software (e.g., one or more software applications) related to the operation of device 1100. In some implementations, memory 1130 may include one or more memories that are coupled to one or more processors (e.g., processor 1120), such as via bus 1110.

Input component 1140 enables device 1100 to receive input, such as user input and/or sensed input. For example, input component 1140 may include a touch screen, a keyboard, a keypad, a mouse, a button, a microphone, a switch, a sensor, a global positioning system sensor, an accelerometer, a gyroscope, and/or an actuator. Output component 1150 enables device 1100 to provide output, such as via a display, a speaker, and/or a light-emitting diode. Communication component 1160 enables device 1100 to communicate with other devices via a wired connection and/or a wireless connection. For example, communication component 1160 may include a receiver, a transmitter, a transceiver, a modem, a network interface card, and/or an antenna.

Device 1100 may perform one or more operations or processes described herein. For example, a non-transitory computer-readable medium (e.g., memory 1130) may store a set of instructions (e.g., one or more instructions or code) for execution by processor 1120. Processor 1120 may execute the set of instructions to perform one or more operations or processes described herein. In some implementations, execution of the set of instructions, by one or more processors 1120, causes the one or more processors 1120 and/or the device 1100 to perform one or more operations or processes described herein. In some implementations, hardwired circuitry is used instead of or in combination with the instructions to perform one or more operations or processes described herein. Additionally, or alternatively, processor 1120 may be configured to perform one or more operations or processes described herein. Thus, implementations described herein are not limited to any specific combination of hardware circuitry and software.

The number and arrangement of components shown in FIG. 11 are provided as an example. Device 1100 may include additional components, fewer components, different components, or differently arranged components than those shown in FIG. 11. Additionally, or alternatively, a set of components (e.g., one or more components) of device 1100 may perform one or more functions described as being performed by another set of components of device 1100.

Figure 12:
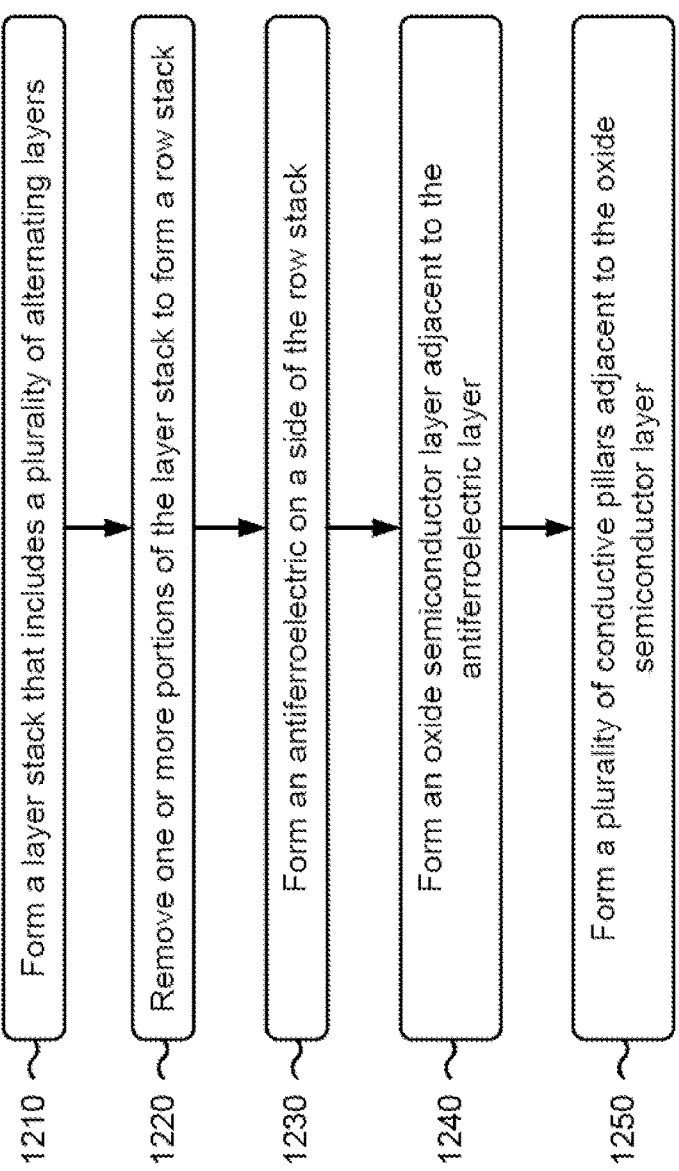
FIG. 12 is a flowchart of an example process associated with forming an antiferroelectric non-volatile memory array.

FIG. 12 is a flowchart of an example process 1200 associated with forming an antiferroelectric non-volatile memory array. In some implementations, one or more process blocks of FIG. 12 are performed by one or more semiconductor processing tools (e.g., one or more of the semiconductor processing tools 102-112). Additionally, or alternatively, one or more process blocks of FIG. 12 may be performed by one or more components of device 1100, such as processor 1120, memory 1130, input component 1140, output component 1150, and/or communication component 1160.

As shown in FIG. 12, process 1200 may include forming a layer stack that includes a plurality of alternating layers (block 1210). For example, one or more of the semiconductor processing tools 102-112 may form a layer stack 702 that includes a plurality of alternating layers, as described above. In some implementations, the plurality of alternating layers include a plurality of conductive layers 704, and a plurality of isolation layers 706.

As further shown in FIG. 12, process 1200 may include removing one or more portions of the layer stack to form a row stack (block 1220). For example, one or more of the semiconductor processing tools 102-112 may remove one or more portions of the layer stack 702 to form a row stack 708, as described above.

As further shown in FIG. 12, process 1200 may include forming an antiferroelectric layer on a side of the row stack (block 1230). For example, one or more of the semiconductor processing tools 102-112 may form an antiferroelectric layer 316 on a side of the row stack 708, as described above.

As further shown in FIG. 12, process 1200 may include forming an oxide semiconductor layer adjacent to the antiferroelectric layer (block 1240). For example, one or more of the semiconductor processing tools 102-112 may form an oxide semiconductor layer 314 adjacent to an antiferroelectric layer 316, as described above.

As further shown in FIG. 12, process 1200 may include forming a plurality of conductive pillars adjacent to the oxide semiconductor layer (block 1250). For example, one or more of the semiconductor processing tools 102-112 may form a plurality of conductive pillars (e.g., a bit line conductive structure 306, a select line conductive structure 308) adjacent to the oxide semiconductor layer 314, as described above.

Process 1200 may include additional implementations, such as any single implementation or any combination of implementations described below and/or in connection with one or more other processes described elsewhere herein.

In a first implementation, process 1200 includes forming a dielectric layer 714 adjacent to the oxide semiconductor layer 314, forming a plurality of openings 716 through the oxide semiconductor layer 314 and through the dielectric layer 714, and forming a plurality of isolation pillars 312 in the plurality of openings 716, where an isolation pillar 312, of the plurality of isolation pillars 312, is located between at least two of the plurality of conductive pillars.

In a second implementation, alone or in combination with the first implementation, forming the plurality of conductive pillars includes forming a dielectric layer 714 adjacent to the oxide semiconductor layer 314, forming a plurality of openings 718 through the dielectric layer 714, and forming the plurality of conductive pillars in the plurality of openings.

In a third implementation, alone or in combination with one or more of the first and second implementations, forming the antiferroelectric layer 316 includes forming a nanosheet stack that includes a first plurality of nanosheets 902A-902n and a second plurality of nanosheets 904A-904m alternating with the first plurality of nanosheets 902A-902n.

In a fourth implementation, alone or in combination with one or more of the first through third implementations, forming the antiferroelectric layer 316 includes performing an anneal operation to cause the first plurality of nanosheets 902A-902n and the second plurality of nanosheets 904A-904m to diffuse into a single-layer structure 906 in the antiferroelectric layer 316.

In a fifth implementation, alone or in combination with one or more of the first through fourth implementations, forming the nanosheet stack includes performing a plurality of ALD cycles that include a first ALD operation in which a nanosheet of the first plurality of nanosheets 902A-902n is deposited, and a second ALD operation in which a nanosheet of the second plurality of nanosheets 904A-904m is deposited on the nanosheet of the first plurality of nanosheets 902A-902n.

In a sixth implementation, alone or in combination with one or more of the first through fifth implementations, performing the first ALD operation includes depositing the nanosheet of the first plurality of nanosheets 902A-902n using a hafnium-containing precursor.

In a seventh implementation, alone or in combination with one or more of the first through sixth implementations, performing the second ALD operation includes depositing the nanosheet of the second plurality of nanosheets 904A-904m using a zirconium-containing precursor.

In an eighth implementation, alone or in combination with one or more of the first through seventh implementations, a time duration of the second ALD operation is greater relative to a time duration of the first ALD operation.

Although FIG. 12 shows example blocks of process 1200, in some implementations, process 1200 includes additional blocks, fewer blocks, different blocks, or differently arranged blocks than those depicted in FIG. 12. Additionally, or alternatively, two or more of the blocks of process 1200 may be performed in parallel.

In this way, an Anti-FeFET of a memory cell includes an antiferroelectric layer instead of a ferroelectric layer. The antiferroelectric layer includes one or more materials having antiferroelectric properties, such as having an ordered (crystalline) array of electric dipoles in which adjacent dipoles are orientated in opposing (antiparallel) directions as opposed to having the dipoles all point in the same direction as in a ferroelectric material. The antiferroelectric layer may operate based on a programmed state and an erased state in which the antiferroelectric layer is in a fully polarized alignment and a non-polarized alignment (or a random state of polarization), respectively. This enables the antiferroelectric layer in the Anti-FeFET to provide a sharper/larger voltage drop for an erase operation of the Anti-FeFET (e.g., in which the Anti-FeFET switches or transitions from the programmed state to the erased state) relative to a ferroelectric material layer that operates based on switching between two opposing fully polarized states.

As described in greater detail above, some implementations described herein provide a non-volatile memory cell structure. The non-volatile memory cell structure includes a bit line conductive structure. The non-volatile memory cell structure includes a select line conductive structure. The non-volatile memory cell structure includes a channel layer extending between the bit line conductive structure and the select line conductive structure. The non-volatile memory cell structure includes an antiferroelectric layer adjacent to the channel layer, where the channel layer is between the antiferroelectric layer and the bit line conductive structure, and between the antiferroelectric layer and the select line conductive structure. The non-volatile memory cell structure includes a word line conductive structure adjacent to the antiferroelectric layer, where the antiferroelectric layer is between the word line conductive structure and the channel layer.

As described in greater detail above, some implementations described herein provide a method. The method includes forming a layer stack that includes a plurality of alternating layers, where the plurality of alternating layers that include a plurality of conductive layers and a plurality of isolation layers. The method includes removing one or more portions of the layer stack to form a row stack. The method includes forming an antiferroelectric layer on a side of the row stack. The method includes forming an oxide semiconductor layer adjacent to the antiferroelectric layer. The method includes forming a plurality of conductive pillars adjacent to the oxide semiconductor layer.

As described in greater detail above, some implementations described herein provide an antiferroelectric memory array. The antiferroelectric memory array includes a plurality of word line conductive structures that are arranged in a first direction. The antiferroelectric memory array includes a plurality of bit line conductive structures and a plurality of select line conductive structures that are arranged in a second direction that is approximately perpendicular to the first direction. The antiferroelectric memory array includes an antiferroelectric layer between the plurality of word line conductive structures and the plurality of bit line conductive structures, and between the plurality of word line conductive structures and the plurality of select line conductive structures. The antiferroelectric memory array includes a plurality of oxide semiconductor layers between the antiferroelectric layer and the plurality of bit line conductive structures, and between the antiferroelectric layer and the plurality of select line conductive structures.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A non-volatile memory cell structure, comprising:
a bit line conductive structure;
a select line conductive structure;
a channel layer extending between the bit line conductive structure and the select line conductive structure;
an antiferroelectric layer adjacent to the channel layer,
wherein the channel layer is between the antiferroelectric layer and the bit line conductive structure, and between the antiferroelectric layer and the select line conductive structure; and a word line conductive structure adjacent to the antiferroelectric layer,
wherein the antiferroelectric layer is between the word line conductive structure and the channel layer, and
wherein the antiferroelectric layer extends along a side of the word line conductive structure from an end of the bit line conductive structure to an end of the select line conductive structure.

2. The non-volatile memory cell structure of claim 1,
wherein the antiferroelectric layer comprises a material that includes zirconium (Zr); and
wherein a concentration of the zirconium in the antiferroelectric layer is included in a range of approximately 50% to approximately 80%.

3. The non-volatile memory cell structure of claim 1,
wherein the antiferroelectric layer is a single-layer structure that includes a plurality of materials; and
wherein the non-volatile memory cell structure comprises:
a dielectric region between the bit line conductive structure and the select line conductive structure,
wherein the channel layer is adjacent to the dielectric region.

4. The non-volatile memory cell structure of claim 1,
wherein the non-volatile memory cell structure is configured to selectively transition between a programmed state and an erased state;
wherein, in the programmed state, the non-volatile memory cell structure is configured to operate in a first polarized state in which the antiferroelectric layer has a particular polarization alignment; and
wherein, in the erased state, the non-volatile memory cell structure is configured to operate in a second polarized state in which the antiferroelectric layer has a random polarization alignment.

5. The non-volatile memory cell structure of claim 1,
wherein the antiferroelectric layer comprises a combination of hafnium (Hf) and zirconium (Zr); and
wherein a concentration of the zirconium in the antiferroelectric layer is greater relative to a concentration of the hafnium in the antiferroelectric layer.

6. The non-volatile memory cell structure of claim 1,
wherein the antiferroelectric layer comprises a combination of hafnium (Hf) and at least one of:
aluminum (Al)
lanthanum (La),
cerium (Ce),
gadolinium (Gd), or
silicon (Si).

7. The non-volatile memory cell structure of claim 1,
wherein a thickness of the antiferroelectric layer is included in a range of approximately 2 nanometers to approximately 20 nanometers.

8. A method, comprising:
forming a layer stack that comprises a plurality of alternating layers,
wherein the plurality of alternating layers comprise:
a plurality of conductive layers, and
a plurality of isolation layers;
removing one or more portions of the layer stack to form a row stack;
forming an antiferroelectric layer on a side of the row stack;
forming an oxide semiconductor layer adjacent to the antiferroelectric layer; and
forming a plurality of conductive pillars adjacent to the oxide semiconductor layer.

9. The method of claim 8, further comprising:

forming a dielectric layer adjacent to the oxide semiconductor layer;

forming a plurality of openings through the oxide semiconductor layer and through the dielectric layer; and forming a plurality of isolation pillars in the plurality of openings, wherein an isolation pillar, of the plurality of isolation pillars, is located between at least two of the plurality of conductive pillars.

10. The method of claim 8, wherein forming the plurality of conductive pillars comprises:

forming a dielectric layer adjacent to the oxide semiconductor layer;

forming a plurality of openings through the dielectric layer; and forming the plurality of conductive pillars in the plurality of openings.

11. The method of claim 8, wherein forming the antiferroelectric layer comprises:

forming a nanosheet stack comprising a first plurality of nanosheets and a second plurality of nanosheets alternating with the first plurality of nanosheets.

12. The method of claim 11, wherein forming the antiferroelectric layer comprises:

performing an anneal operation to cause the first plurality of nanosheets and the second plurality of nanosheets to diffuse into a single-layer structure in the antiferroelectric layer.

13. The method of claim 11, wherein forming the nanosheet stack comprises:

performing a plurality of atomic layer deposition (ALD) cycles comprising:

a first ALD operation in which a nanosheet of the first plurality of nanosheets is deposited, and a second ALD operation in which a nanosheet of the second plurality of nanosheets is deposited on the nanosheet of the first plurality of nanosheets.

14. The method of claim 13, wherein performing the first ALD operation comprises:

depositing the nanosheet of the first plurality of nanosheets using a hafnium-containing precursor.

15. The method of claim 14, wherein performing the second ALD operation comprises:

depositing the nanosheet of the second plurality of nanosheets using a zirconium-containing precursor.

16. The method of claim 15, wherein a time duration of the second ALD operation is greater relative to a time duration of the first ALD operation.

17. An antiferroelectric memory array structure, comprising:

a plurality of word line conductive structures that are arranged in a first direction;

a plurality of bit line conductive structures and a plurality of select line conductive structures that are arranged in a second direction that is approximately perpendicular to the first direction;

an antiferroelectric layer between the plurality of word line conductive structures and the plurality of bit line conductive structures, and between the plurality of word line conductive structures and the plurality of select line conductive structures; and a plurality of oxide semiconductor layers between the antiferroelectric layer and the plurality of bit line conductive structures, and between the antiferroelectric layer and the plurality of select line conductive structures, wherein the antiferroelectric layer extends in the second direction along sides of the plurality of word line conductive structures from an end of at least one bit line conductive structure of the plurality of bit line conductive structures to an end of at least one select line conductive structure of the plurality of select line conductive structures.

18. The antiferroelectric memory array structure of claim 17, wherein each of a plurality of antiferroelectric field effect transistors (Anti-FeFETs) of the antiferroelectric memory array comprise:

a portion of a word line conductive structure of the plurality of word line conductive structures;

a portion of a bit line conductive structure of the plurality of bit line conductive structures;

a portion of a select line conductive structure of the plurality of select line conductive structures;

a portion of the antiferroelectric layer; and a portion of an oxide semiconductor layer of the plurality of oxide semiconductor layers.

19. The antiferroelectric memory array structure of claim 17, wherein the antiferroelectric layer comprises an oxide material that includes a combination of hafnium (Hf) and at least one of:

aluminum (Al), lanthanum (La), cerium (Ce), gadolinium (Gd), or silicon (Si).

20. The antiferroelectric memory array structure of claim 17, wherein the antiferroelectric layer comprises a combination of hafnium (Hf) and zirconium (Zr); and wherein a concentration of the zirconium in the antiferroelectric layer is greater relative to a concentration of the hafnium in the antiferroelectric layer.

* * * * *